(12) United States Patent
Coursey

(10) Patent No.: US 6,974,993 B2
(45) Date of Patent: Dec. 13, 2005

(54) DOUBLE-SIDED CAPACITOR STRUCTURE FOR A SEMICONDUCTOR DEVICE AND A METHOD FOR FORMING THE STRUCTURE

(75) Inventor: Belford T. Coursey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/941,735

(22) Filed: Sep. 13, 2004

(65) Prior Publication Data

US 2005/0035392 A1 Feb. 17, 2005

Related U.S. Application Data

(62) Division of application No. 10/150,622, filed on May 17, 2002, now Pat. No. 6,790,725.

(51) Int. Cl.$^7$ .......................................... H01L 21/8242
(52) U.S. Cl. ...................... 257/306; 257/308; 257/309
(58) Field of Search ................................. 257/295–311

(56) References Cited

U.S. PATENT DOCUMENTS

| 6,060,355 A | 5/2000 | Batra et al. .................. 438/255 |
| 6,133,599 A | * 10/2000 | Sung et al. .................. 257/296 |
| 6,159,818 A | 12/2000 | Durcan et al. .............. 438/387 |

\* cited by examiner

*Primary Examiner*—H. Jey Tsai
(74) *Attorney, Agent, or Firm*—Kevin D. Martin

(57) ABSTRACT

A method used to manufacture a semiconductor device comprises providing a first conductive container capacitor top plate layer and etching the first conductive container capacitor top plate layer to form a plurality of openings therein. Subsequently, a container capacitor bottom plate layer is formed within the plurality of openings in the top plate layer such that the bottom plate layer defines a plurality of openings. A second conductive container capacitor top plate layer is formed within the plurality of openings in the bottom plate layer. The first conductive container capacitor top plate layer is electrically coupled with the second conductive container capacitor top plate layer. The first and second conductive container capacitor top plate layers and the container capacitor bottom plate layer form a plurality of container capacitors. A structure resulting from the method is also disclosed.

12 Claims, 30 Drawing Sheets

DOUBLE-SIDED CAPACITOR STRUCTURE FOR A SEMICONDUCTOR DEVICE AND A METHOD FOR FORMING THE STRUCTURE

This is a division of U.S. Ser. No. 10/150,622 filed May 17, 2002 and issued Sep. 14, 2004 as U.S. Pat. No. 6,790,725.

FIELD OF THE INVENTION

This invention relates to the field of semiconductor manufacture and, more particularly, to a double-sided capacitor structure and a method for forming the structure.

BACKGROUND OF THE INVENTION

During the manufacture of semiconductor devices which comprise memory elements, such as dynamic random access memories (DRAMs), static random access memories (SRAMs), and some microprocessors, container capacitors are commonly formed. Container capacitors are well known to allow an increased stored charge over planar capacitors by increasing the surface area on which the charge can be stored. To further increase the surface area on which the charge can be stored, polysilicon storage nodes are commonly converted to hemispherical silicon grain (HSG) polysilicon. This material has a roughened surface compared with non-HSG polysilicon, and therefore an increased surface area on which a charge can be stored.

FIGS. 1–8 depict a conventional method for forming a container capacitor from HSG polysilicon. FIG. 1 depicts a semiconductor wafer substrate assembly 10 comprising a semiconductor wafer 12 having a plurality of doped areas 14 which allow proper operation of a plurality of transistors 16. Each transistor comprises gate oxide 18, a doped polysilicon control gate 20, silicide 22 such as tungsten silicide to increase conductivity of the control gate, and a capping layer 24 of tetraethyl orthosilicate (TEOS) oxide. Silicon nitride spacers 26 insulate the control gate 20 and silicide 22 from polysilicon pads 28 to which the container capacitors will be electrically coupled. Further depicted in FIG. 1 is shallow trench isolation (STI, field oxide) 30 which reduces unwanted electrical interaction between adjacent control gates, and a thick layer of deposited oxide 32 such as borophosphosilicate glass (BPSG). A patterned photoresist layer 34 defines the location of the container capacitors to be formed. The FIG. 1 structure may further include one or more bit (digit) lines under the TEOS layer or various other structural elements or differences which, for simplicity of explanation, have not been depicted.

The FIG. 1 structure is subjected to an anisotropic etch which removes the exposed portions of the BPSG layer to form a patterned BPSG layer which provides a base dielectric having a recess for the container capacitor. During this etch the polysilicon pads 28 and possibly a portion of TEOS capping layer 24 are exposed as depicted in FIG. 2. The remaining photoresist layer is stripped and any polymer (not depicted) which forms during the etch is removed according to means known in the art to provide the FIG. 3 structure.

As depicted in FIG. 4, a blanket polysilicon layer 40 is formed conformal with the deposited oxide layer, and will provide a container capacitor storage node for the completed capacitor. A thick blanket filler material 42, such as photoresist, is formed to fill the containers provided by polysilicon 40. The FIG. 4 structure is then subjected to a planarizing process, such as a chemical planarization, a mechanical planarization, or a chemical mechanical planarization (CMP) step. This process removes horizontal portions of the photoresist 42, the polysilicon 40, and likely a portion of the BPSG 32 to result in the FIG. 5 structure.

Next, the BPSG 32 is partially etched with an etch selective to polysilicon (i.e. an etch which minimally etches or, preferably, doesn't etch polysilicon) to result in the structure of FIG. 6. At this point in the process the polysilicon storage nodes 40 are only minimally supported. The bottom plates 40 in the FIG. 6 structure each comprise a first region 60 which defines a recess, and a second region 62 which defines an opening to the recess, with the first and second regions being continuous, each with the other. In other words, the bottom plate 40 of FIG. 6 defines a receptacle having a rim 62 which defines an opening to the interior of the receptacle. The regions 60, 62 form vertically-oriented sides of the bottom plate, and the sides are electrically-coupled by a horizontally-oriented bottom 64.

After etching the BPSG, a process is performed which converts the smooth polysilicon to HSG polysilicon storage plates 70 as depicted in FIG. 7. Various processes for converting the smooth polysilicon to HSG polysilicon are known in the art.

After performing the conversion of the smooth polysilicon to HSG polysilicon, a cell dielectric layer 80, for example a layer of high-quality cell nitride, a polysilicon container capacitor top plate 82, and a planar oxide layer such as BPSG 84 are formed according to means known in the art to result in the FIG. 8 structure. Subsequently, wafer processing continues according to means known in the art.

One problem which can result during the process described above is flaking of the HSG polysilicon from the storage node 70 as depicted in FIG. 9. These loose portions 90 are conductive and thus, when they break off and contact two adjacent conductive structures, can short the structures together and result in a malfunctioning or nonfunctioning device. Typically, the greatest number of such defect occurs at the top of the storage plates. This may occur as these ends are not protected by adjacent structures. This may also occur because as wafer processing continues the tops are the most likely portion of the storage plate to be contacted during a CMP or other step, and also incur the highest stresses.

Another problem which can occur with the process described above results from the very close lateral spacing between adjacent storage plates. As a design goal of semiconductor engineers is to form as many storage capacitors per unit area as possible, and there are typically several million storage capacitors on each memory chip, even a small decrease in spacing between features can allow for the formation of many more features in the same area. Thus the capacitors are formed as close together as wafer processing will allow. As the roughened polysilicon grains grow, grains from two adjacent plates can form a bridge 92 between the two plates and thus short them together to result in a malfunctioning device.

Forming the capacitor structures close together such that there is very little space between adjacent double-sided containers also makes it likely that particles of contamination will be trapped between adjacent containers to result in shorting between the containers. Given the normally tight and deep spaces of the structure, it is difficult or impossible to reliably remove the particles which contaminate the wafer surface with conventional cleaning steps currently available in the field of semiconductor device manufacturing.

A method used to form container capacitor storage plates which reduces or eliminates the problems described above, and a structure resulting therefrom, would be desirable.

SUMMARY OF THE INVENTION

The present invention provides a new method which, among other advantages, reduces problems associated with the manufacture of semiconductor devices, particularly problems resulting during the formation of double-sided capacitor structures (i.e. capacitor structures having the capacitor top plate formed on two sides of the bottom plate, the inside and the outside of the container, as depicted in FIG. 8). In accordance with one embodiment of the invention an opening is provided in an oxide layer and a first continuous polysilicon layer is formed within the opening. The first polysilicon layer is planarized, for example using a mechanical or chemical mechanical polishing (CMP) process. The first polysilicon layer, which will form a portion of the capacitor top plate, is then etched to form a plurality of recesses therein.

After forming the plurality of recesses in the first polysilicon layer, a blanket cell dielectric layer and a blanket second polysilicon layer are formed within the recesses. The second polysilicon and the cell dielectric are cleared from horizontal surfaces, including the upper surface of the first polysilicon layer. As the second polysilicon layer provides a seed layer for a roughened or textured layer such as a hemispherical silicon grain (HSG) polysilicon layer, the second polysilicon layer is converted to HSG polysilicon. Subsequently, the upper surface of the structure is planarized to remove the polysilicon from the surface, then the first and second polysilicon layers are recessed within the oxide using an etch selective to oxide (i.e. an etch which minimally etches or, preferably, does not etch oxide during etching of the polysilicon). A second cell dielectric layer is formed, and a third polysilicon layer is provided over the second cell dielectric layer, and within the recess formed in the plurality of recesses in the first polysilicon layer, which will form a second capacitor top plate layer.

After forming the second top plate layer, the first and second top plate layers are electrically coupled. Wafer processing continues according to means known in the art.

Using this process the highest defect source for HSG flaking is removed as a flaking source, which results in decreased device defects. Various embodiments of the inventive method, and an inventive structure resulting from the method, are described.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

A first embodiment of an inventive method for forming a container capacitor structure is depicted in FIGS. 11–25.

Figure 1:
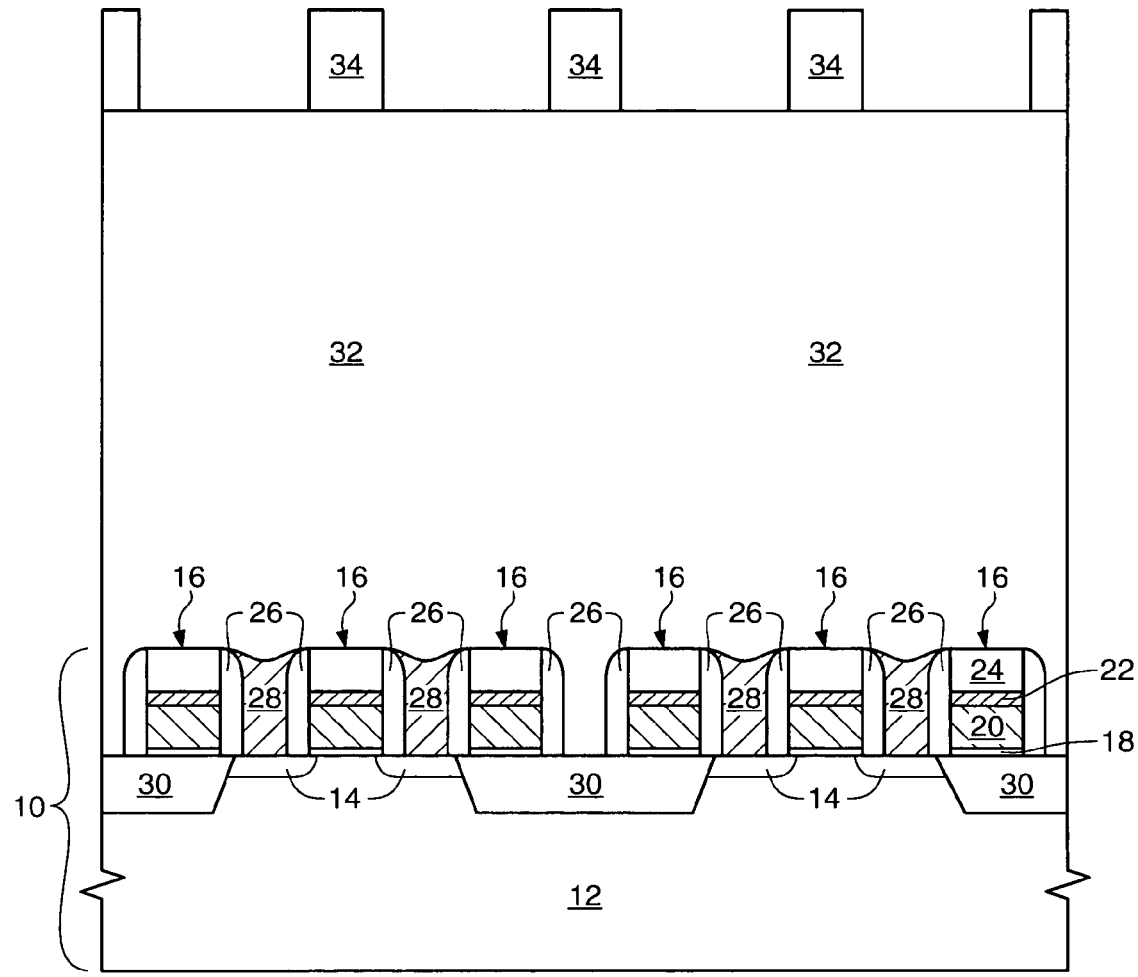
FIGS. 1–8 are cross sections depicting a conventional process for forming a container capacitor.
Figure 2:
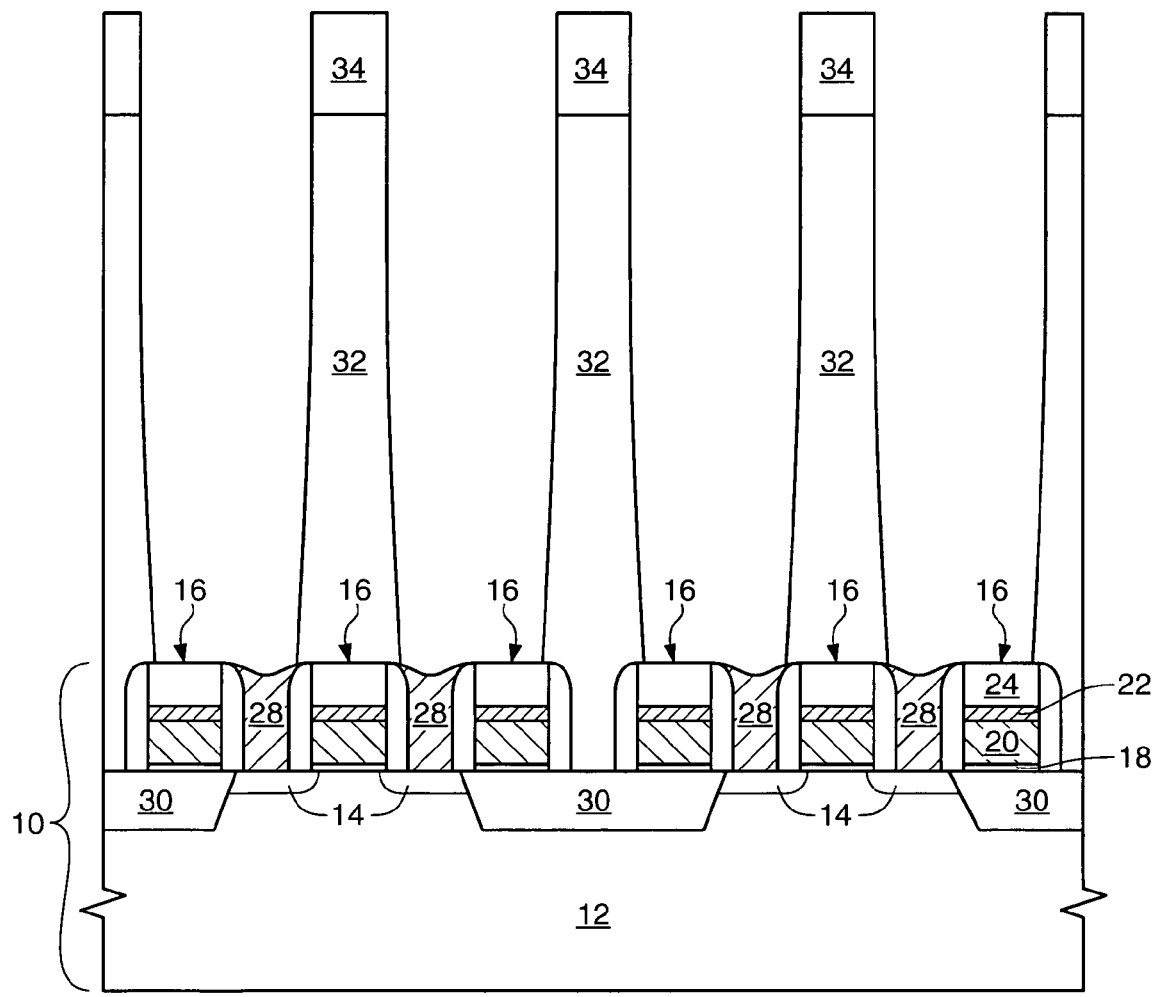
Figure 3:
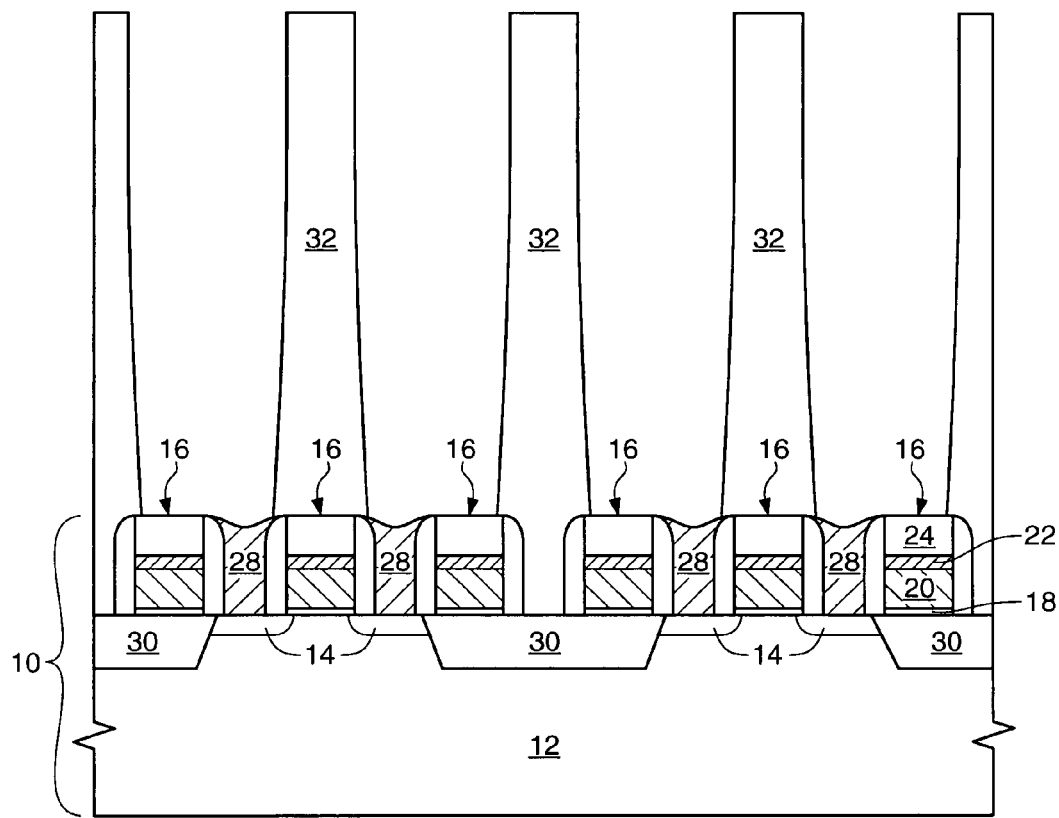
Figure 4:
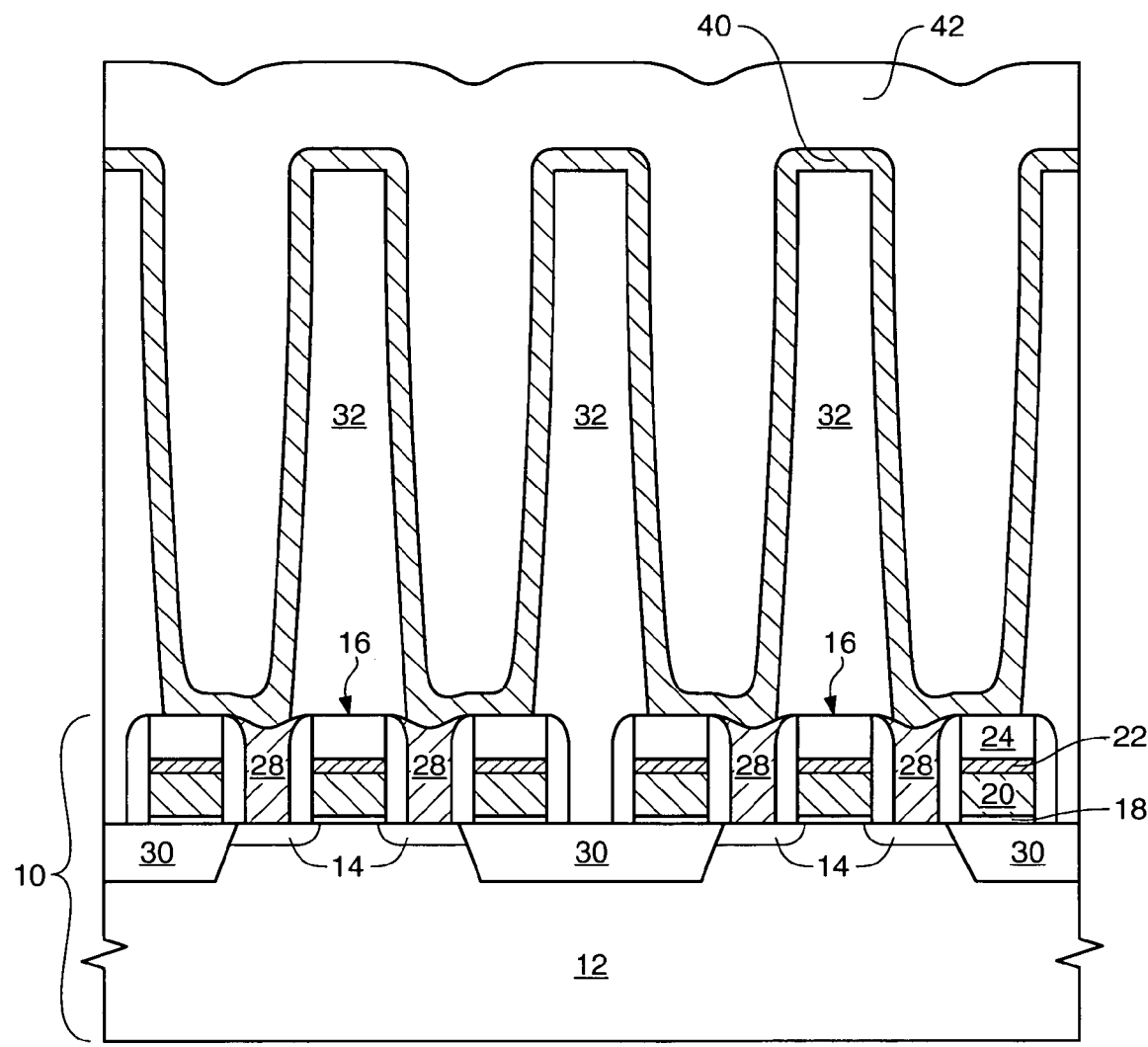
Figure 5:
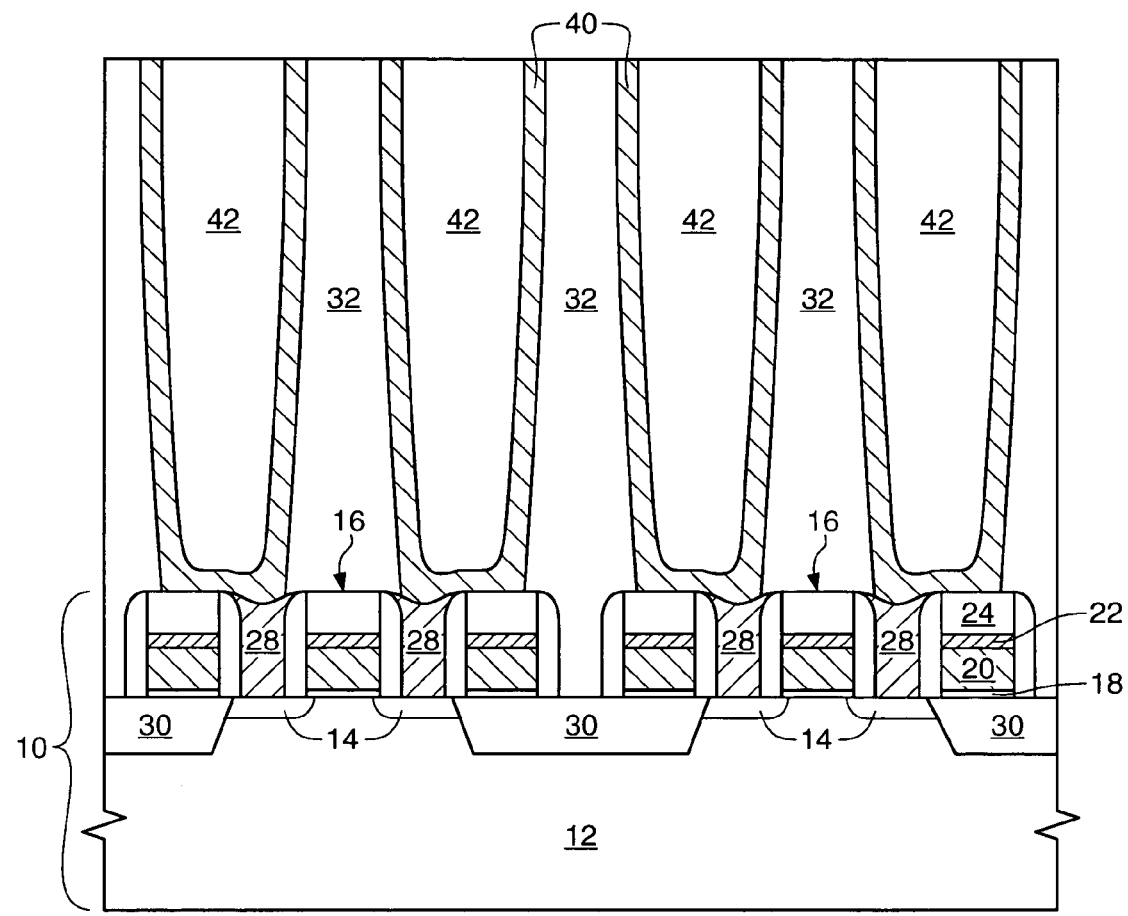
Figure 6:
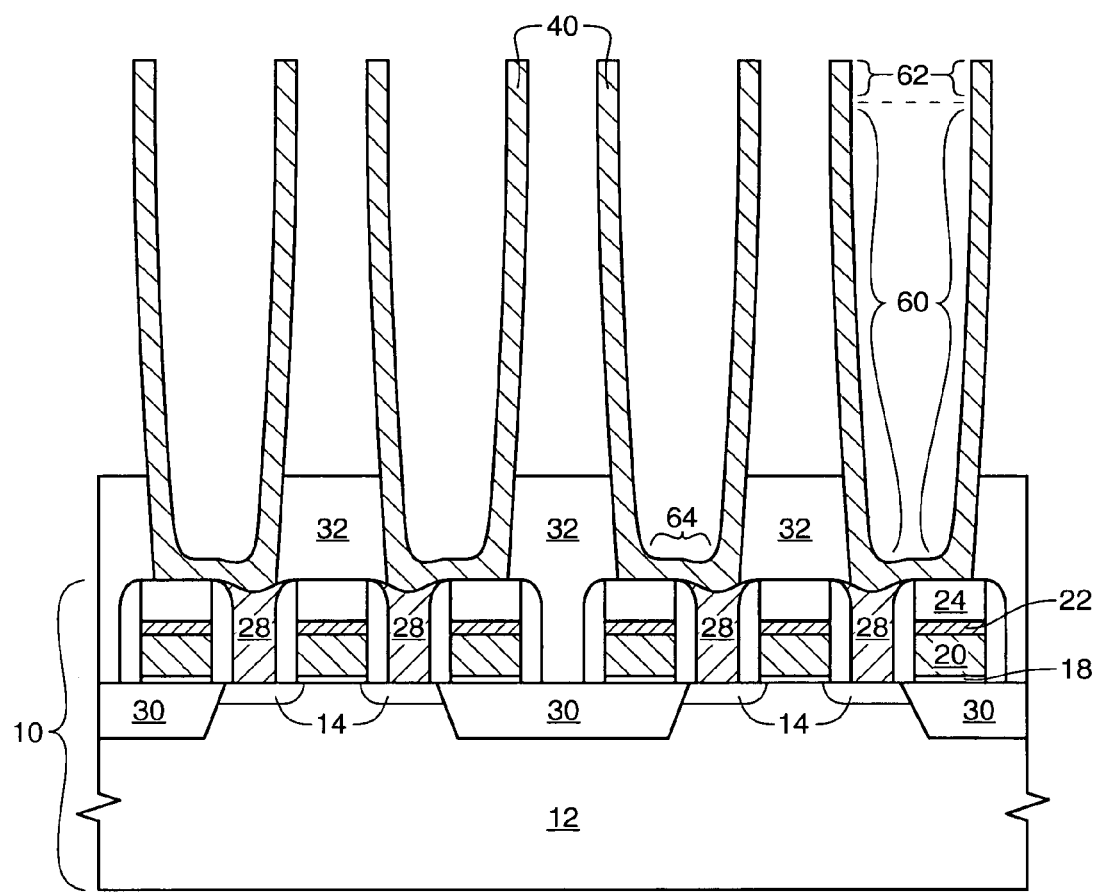
Figure 7:
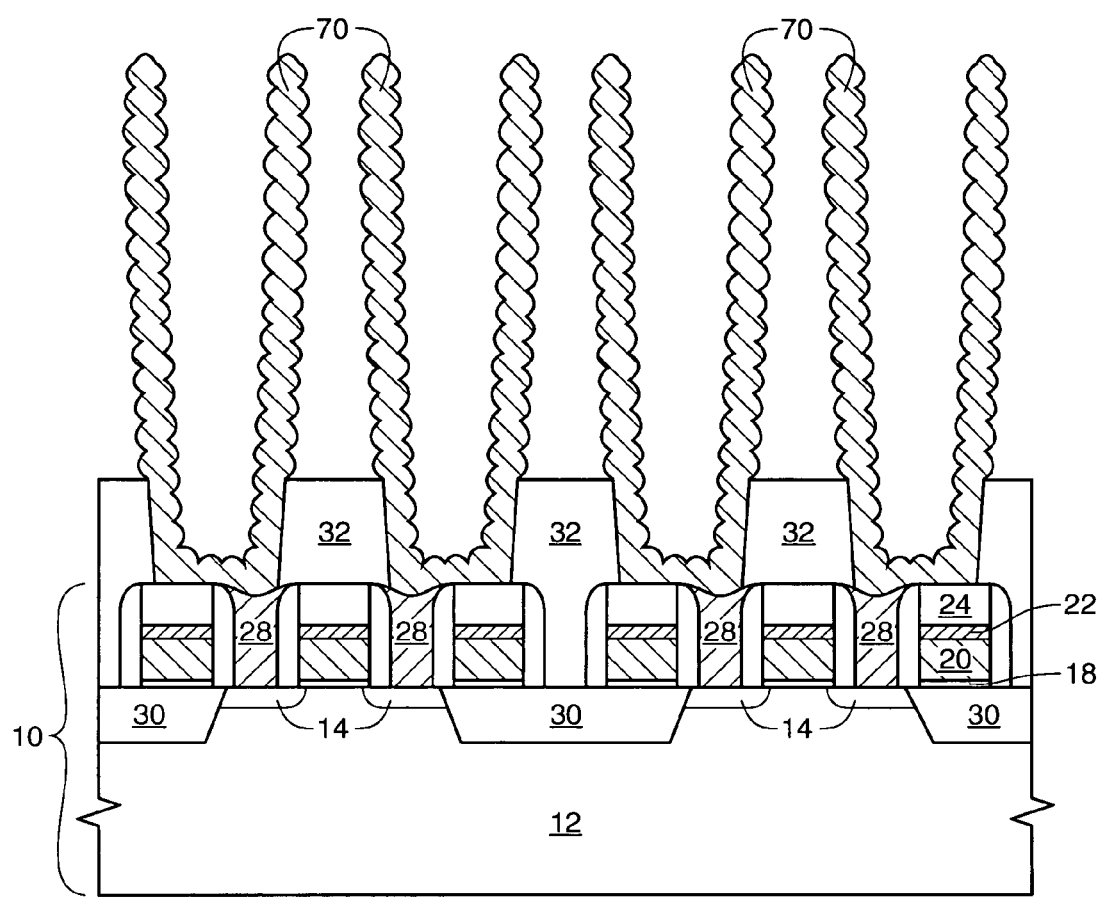
Figure 8:
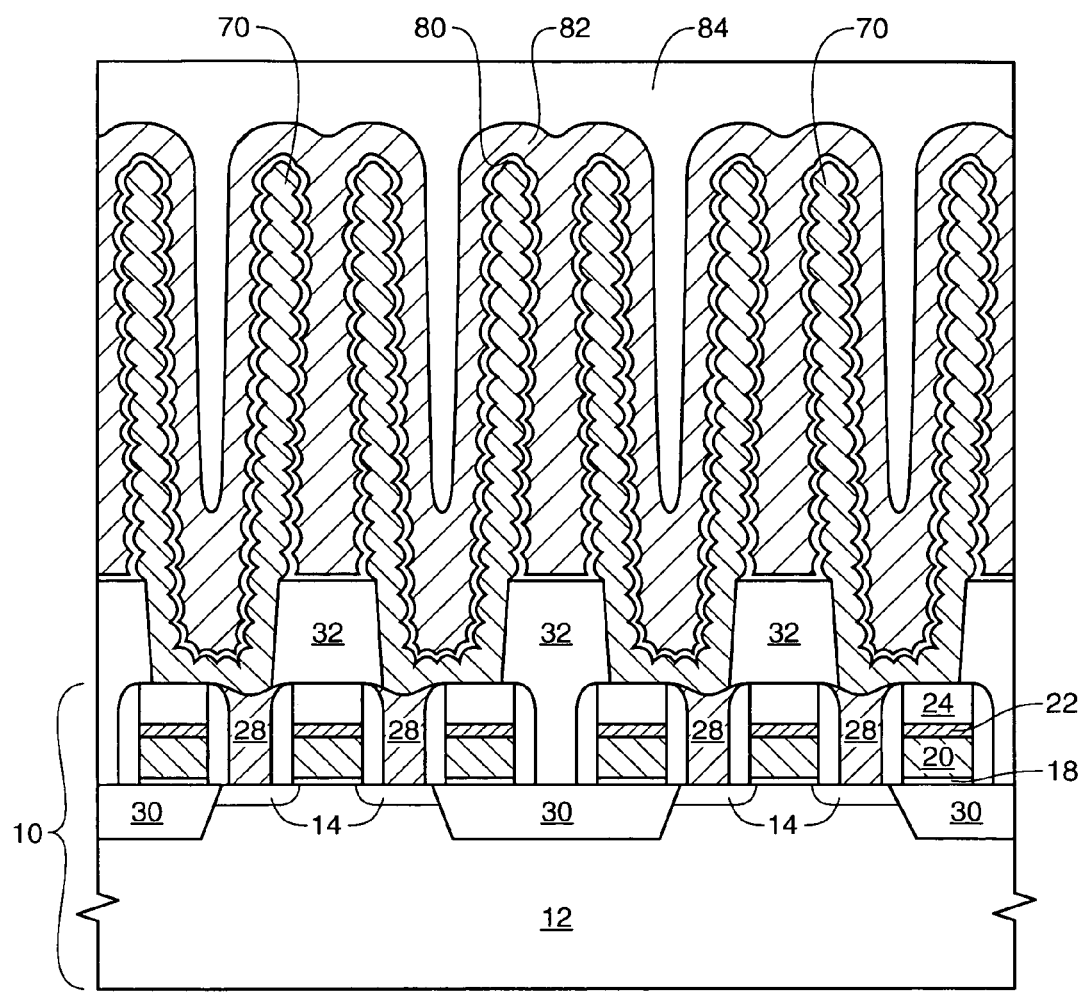
Figure 9:
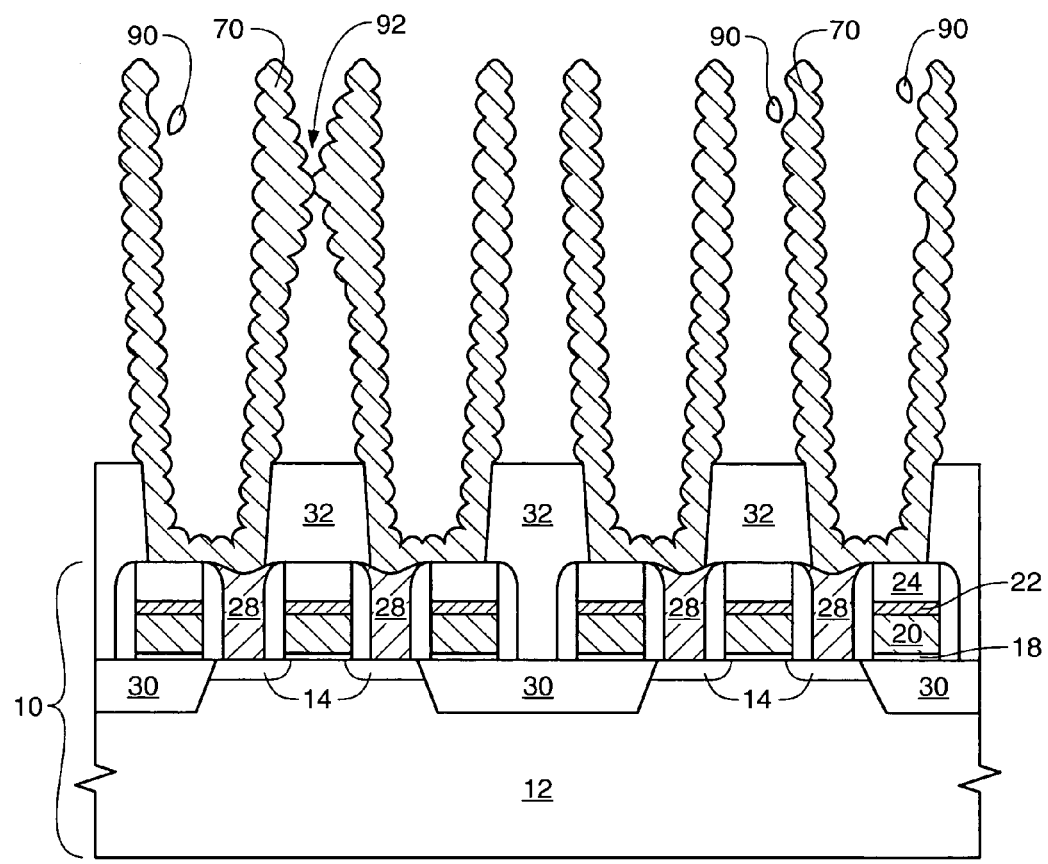
FIG. 9 is a cross section depicting two possible failure modes which may occur during the conventional process of FIGS. 1–8.
Figure 10:
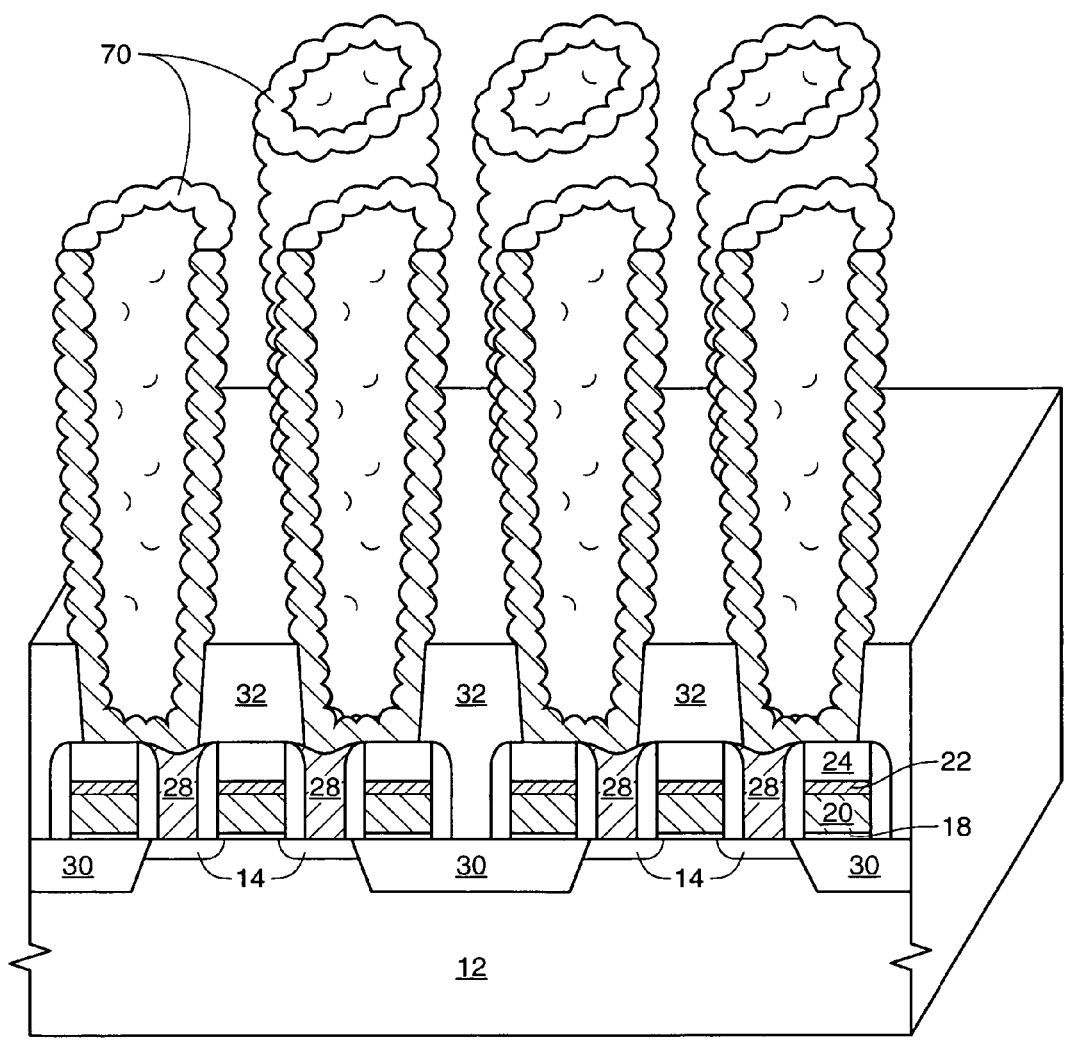
FIG. 10 is a cross-sectional isometric view depicting an array of container capacitor storage plates prior to formation of cell dielectric and the capacitor top plate.
Figure 11:
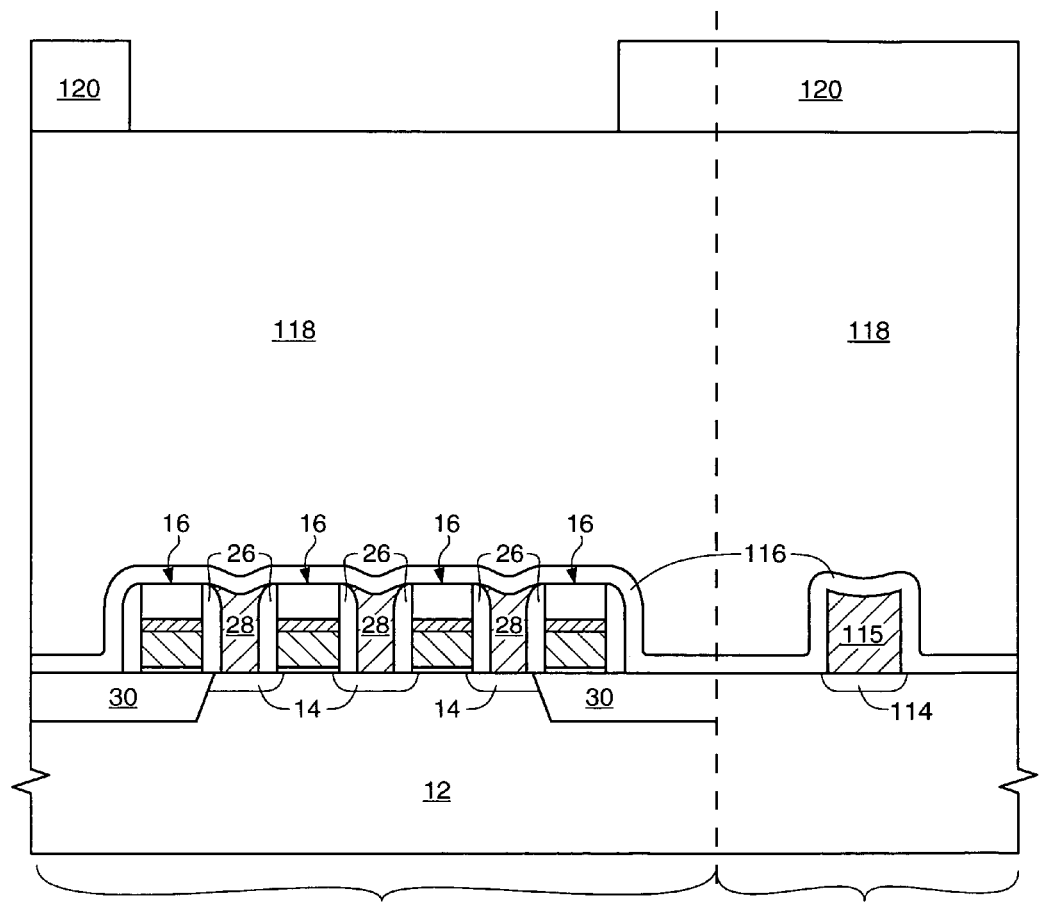
FIGS. 11–22 are cross sections depicting intermediate structures obtained during an embodiment of the present invention.

FIG. 11 depicts a semiconductor structure having elements in common to those of FIG. 1 including a semiconductor wafer 12, source/drain regions 14, transistors 16, and shallow trench isolation 30. FIG. 11 further depicts a region within a container capacitor array 110, and a region in a periphery 112 of the device. While four transistors 16 are depicted in the array 110, it is likely that several thousand transistors, and more likely that several million transistors, will be located in the array. The periphery 112 comprises a diffusion region 114 to which a conductive pad 115 is electrically coupled, formed at the same time as pads 28. It should be noted that simultaneous processing on the array and on the periphery of the device is described herein to demonstrate that such simultaneous processing is possible. The inventive processing may also be carried out on only the array of the device, while processing in the periphery is performed separately.

FIG. 11 further depicts an optional etch stop layer 116 such as a silicon nitride layer between about 50 angstroms (Å) and about 1,000 Å thick, a deposited and planarized dielectric layer 118 such as a layer of borophosphosilicate glass (BPSG) between about 5,000 Å and about 50,000 Å thick, and a patterned photoresist layer 120. The patterned photoresist layer exposes dielectric 118 in the region of the array in which container capacitors will be formed. The width of the exposed portion of the dielectric can extend the entire length and width of the entire array, or the photoresist can expose the array using a plurality of openings, with each opening exposing a portion of the array. In most uses of the invention, however, the entire area of the wafer substrate assembly which will eventually comprise memory container capacitors will be exposed by the photoresist layer whether through one or more than one opening in the photoresist.

Figure 12:
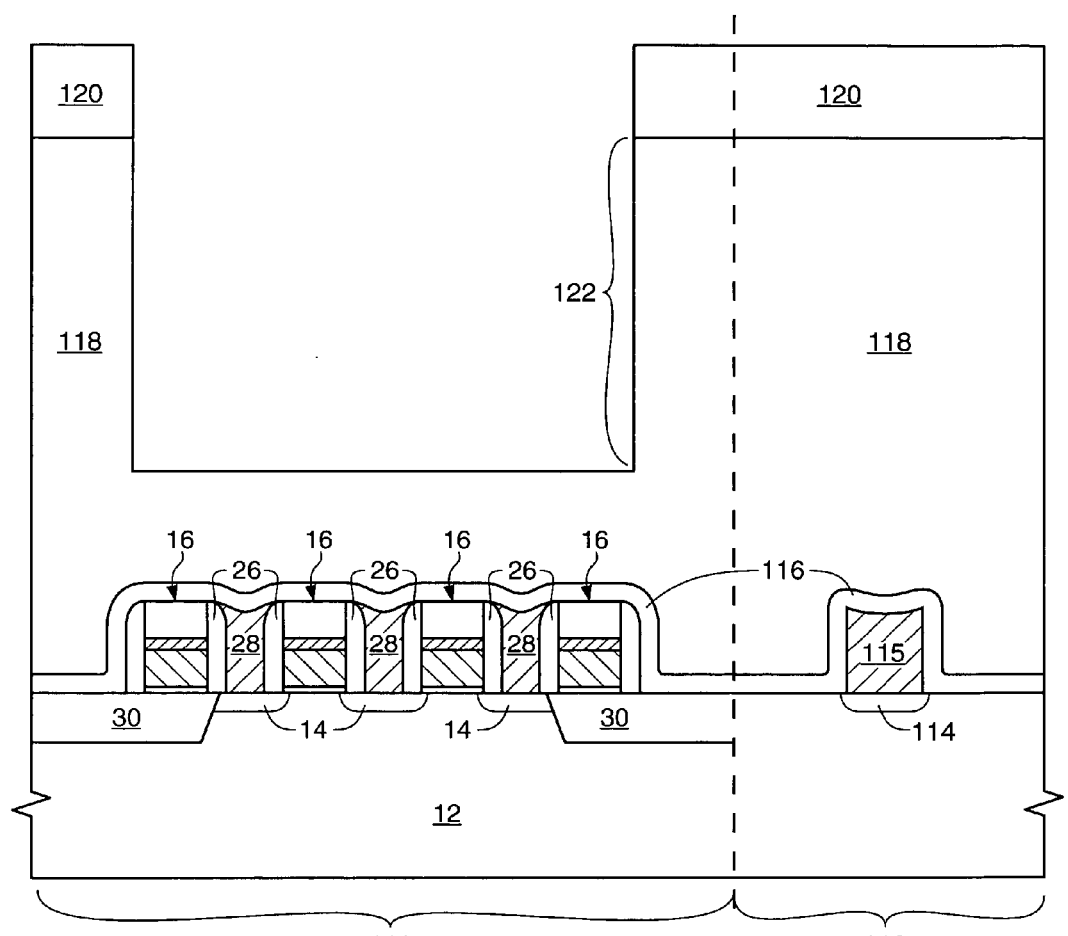

Next, as depicted in FIG. 12, the dielectric layer 118 is only partially etched through its thickness to form a well 122 within the dielectric 118. Generally, between about half to about three-quarters of the dielectric layer thickness will be etched. Further, the depth of the etch is proportional to the capacitance of the completed capacitor, but the underlying layers should not, in most embodiments, be exposed at this point in the process.

Figure 13:
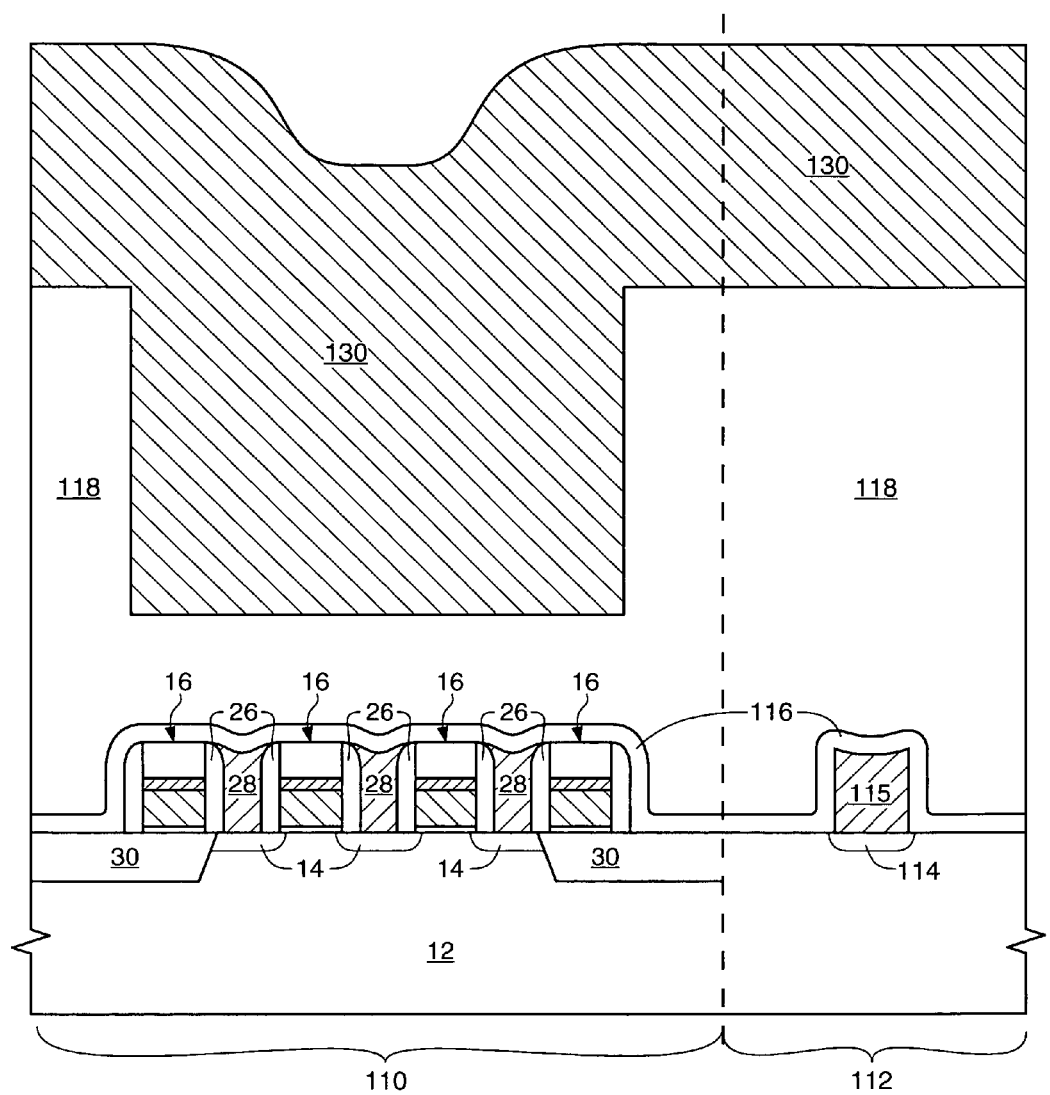

After the dielectric 118 is etched to result in well 122, the photoresist 120 is removed and a blanket first capacitor top plate layer 130 is formed over the wafer surface as depicted in FIG. 13. The preferred first top plate material is polysilicon, and is referred to as such throughout this document, however other materials may also function sufficiently with modifications, such as different etches, which will be apparent to one of skill in the art from the information herein. The thickness of the polysilicon 130 is equal to or thicker than the depth of the well entirely filling the well. Any excess polysilicon which overfills the well will be removed in subsequent processing. A conductive layer of conductively-doped polycrystalline silicon 130 between about 5,000 Å and about 80,000 Å may be formed using plasma enhanced chemical vapor deposition (PECVD) techniques. For example, silane gas ($SiH_4$) is introduced as a silicon source into a deposition chamber at a flow rate of between about 400 standard cubic centimeters (sccm) and about 600 sccm along with phosphine ($PH_3$) at a flow rate of between about 5 sccm and about 15 sccm at a temperature of between about 500° C. and about 600° C. Using this process the preferred material is formed at a rate of between about 10 Å/min to about 20 Å/min, so for the well between about 5,000 Å and about 50,000 Å, a polysilicon processing duration of between about 8.3 hours and about 83.3 hours is required to form a conductively-doped layer.

Figure 14:
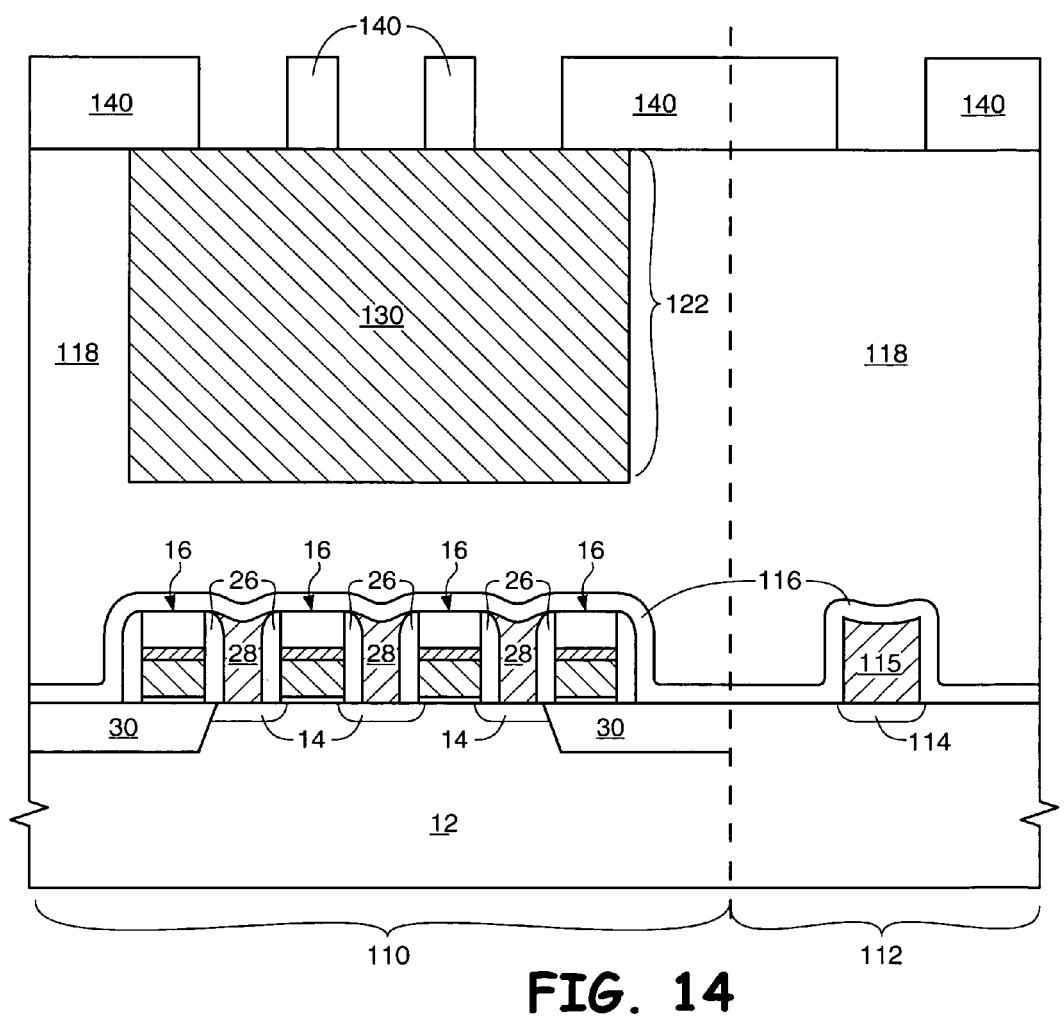

After forming the structure of FIG. 13, at least the capacitor top plate layer 130 is planarized to result in a substantially planar top plate layer 130 as depicted in FIG. 14. Layer 130 can be planarized using mechanical polishing or chemical mechanical polishing (CMP). Further, a portion of the dielectric 118 may also be removed during polishing of layer 130, for example if layer 130 has been formed to less than completely fill the well 122. The polishing results in removal of the capacitor top plate layer 130 from the upper surface of the dielectric 118, and preferably results in the first top plate layer remaining 130 remaining only in the well.

After forming and planarizing layer 130, a patterned photoresist layer 140 is formed over the top plate layer 130 and dielectric 118 as depicted in FIG. 14. Openings in the resist 140 expose locations of the top plate layer 130 and dielectric 118 which are to be etched, for example the portions overlying contact pads 28.

Next, the exposed portions of top plate layer 130 and dielectric 118 are etched down to the level of the etch stop layer 116. An anisotropic etch which removes only polysilicon can be used to etch layer 130 to expose layer 118 under top plate layer 130, then once dielectric 118 is exposed a second etch can be used to remove layer 118 in the array 110 and in the periphery 112 down to the level of etch stop 116. An etch which removes polysilicon selective to dielectric such as BPSG (i.e. removes polysilicon with little or no etching of the dielectric 118) includes exposing the polysilicon to $Cl_2$ and $CF_4$ in a 3:1 ratio at a pressure of about 10 millitorr and at a power of about 300 watts in a high-density tool. The etch can also be performed in a reactive ion etcher (RIE) tool at a pressure of about 100 millitorr and a power of about 300 watts using $Cl_2$ and HBr in a 1:3 ratio. After the thickness of the first top plate layer is removed to expose dielectric 118 which forms the bottom of well 122, etching stops due to the low or nonexistent etch rate of dielectric 118 during the etch of the first top plate layer. After etching the first top plate layer 130 it will typically comprise a continuous layer having a plurality of round or oval openings therein, or possible openings of another shape, when viewed from above. This etch forms cross-sectional sidewalls in polysilicon 130 which define the openings therein. After etching the openings in layer 130, an anisotropic dielectric etch is performed which removes layer 118 selective to the etch stop layer 116 to result in the FIG. 15 structure. An anisotropic etch which removes the dielectric of layer 118, for example BPSG, selective to the etch stop layer, for example to stop on silicon nitride ($Si_3N_4$), includes the use of $C_4F_8$, argon, and $O_2$ at a pressure of about 30 millitorr and a power of 1500 watts in a reactive ion etcher. In the alternative to using the two etches as described above, one for the first top layer 130 and a second for dielectric layer 118, a single anisotropic etch can be performed which removes layer 130 and layer 118 selective to layer 116.

Etch stop layer 116 therefore allows etching of materials with different etch rates (the first top plate layer 130 and dielectric layer 118), or different thicknesses, without over etching an underlying layer. An alternative would be to omit the formation of etch stop layer 116, then etch layer 130 with an etch which removes polysilicon 130 selective to dielectric 118. Subsequently, after removing the thickness of layer 130 to expose layer 118 underneath, an etch is performed which removes dielectric 118 selective to the material of layer 28 and 115. This would require an etch which is highly selective to prevent etching of layers 28 and 115 during an extended etch of dielectric 118 to expose pad 115.

Figure 15:
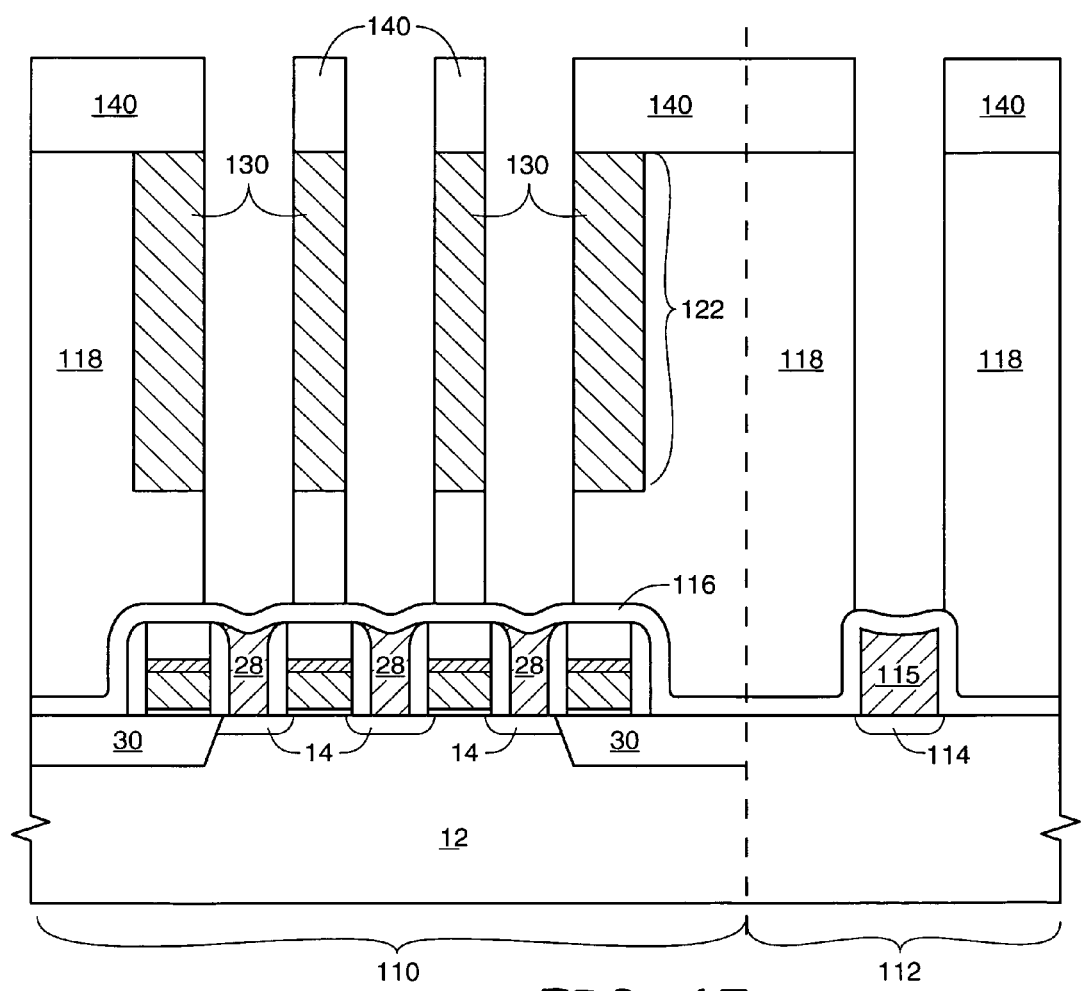
Figure 16:
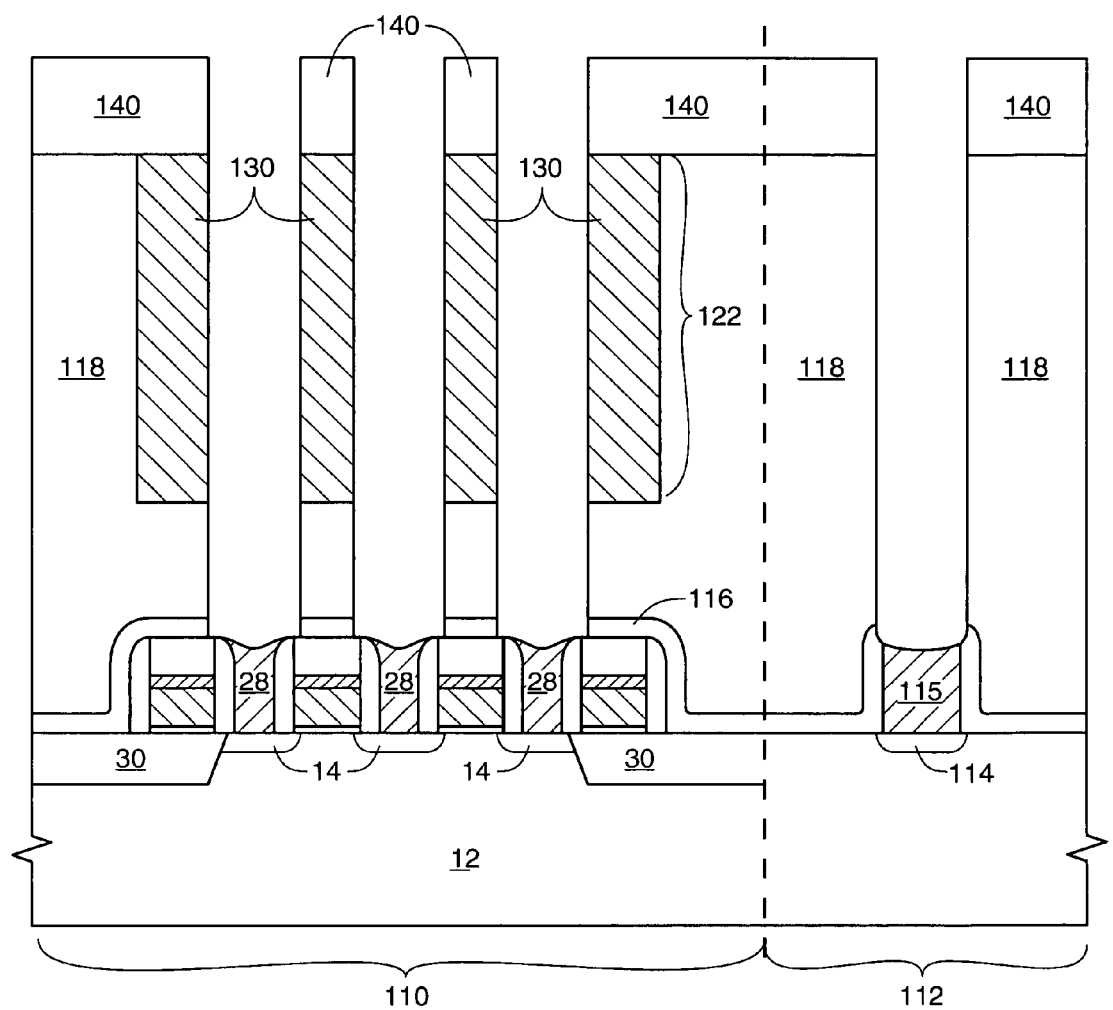

After forming the FIG. 15 structure the etch stop layer is etched to expose pads 28 and 115 as depicted in FIG. 16. An anisotropic etch of a silicon nitride etch stop layer may comprise an etch using $CF_4$ or $CHF_3$ and argon at a pressure of about 30 millitorr and a power of about 350 watts. This etches the $Si_3N_4$ with little or no etching of the pads 28 and 115, and results in the structure of FIG. 16.

Figure 17:
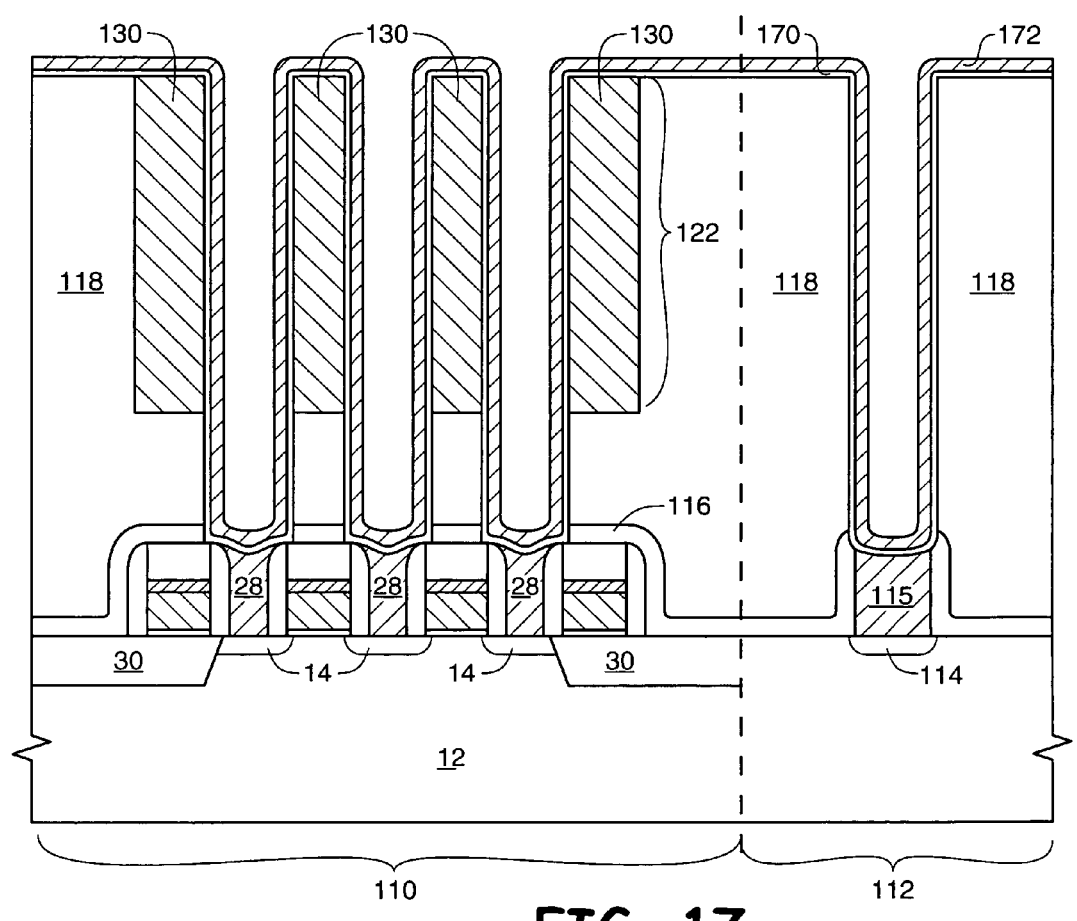

After forming the FIG. 16 structure a first layer of cell dielectric 170 and a capacitor bottom plate seed layer 172 are formed as depicted in FIG. 17. A cell dielectric layer 170, such as cell nitride, can be formed according to means known in the art. A polysilicon bottom plate seed layer 172 having a target thickness of between about 50 Å and about 150 Å may be formed using plasma enhanced chemical vapor deposition (PECVD) techniques. For example, silane gas ($SiH_4$) is introduced as a silicon source into a deposition chamber at a flow rate of between about 400 sccm and about 600 sccm along with phosphine ($PH_3$) at a flow rate of between about 5 sccm and about 15 sccm at a temperature of between about 500° C. and about 600° C. for a duration of between about 2.5 minutes and about 15 minutes. Using this process the preferred material is formed at a rate of between about 10 Å/min to about 20 Å/min. As the layer forms the $PH_3$ flow rate may be decreased to 0 sccm over a period of about 10 seconds as the layer approaches about half its final thickness. This forms a layer 172 of between about 50 Å and about 150 Å thick.

Figure 18:
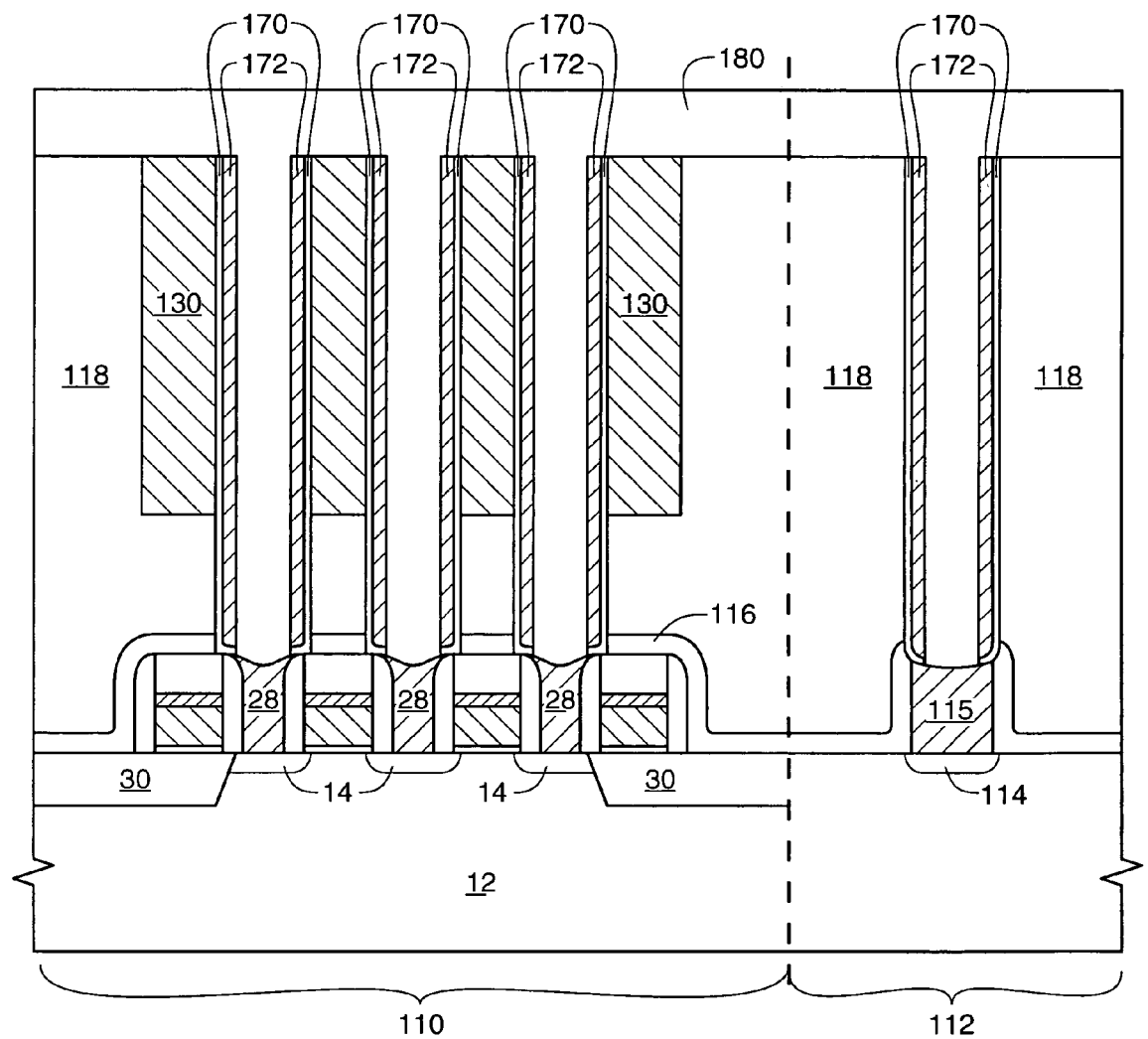

Next, the first cell dielectric layer 170 and bottom plate seed layer 172 are removed from horizontal surfaces of the FIG. 17 structure using a spacer etch which etches the seed layer at a slower rate than it etches the dielectric to result in the etched nitride 170 and polysilicon as depicted in FIG. 18. A spacer etch is also known to etch horizontal surfaces at a faster rate than vertical surfaces. This etch forms spacer structures from the bottom plate seed layer 172, and may partially etch the first top plate layer 130. FIG. 18 further depicts a planar photoresist layer 180 formed after the spacer etch. A CMP step is performed on the FIG. 18 structure to result in the structure of FIG. 19 which has a planar upper surface.

Figure 19:
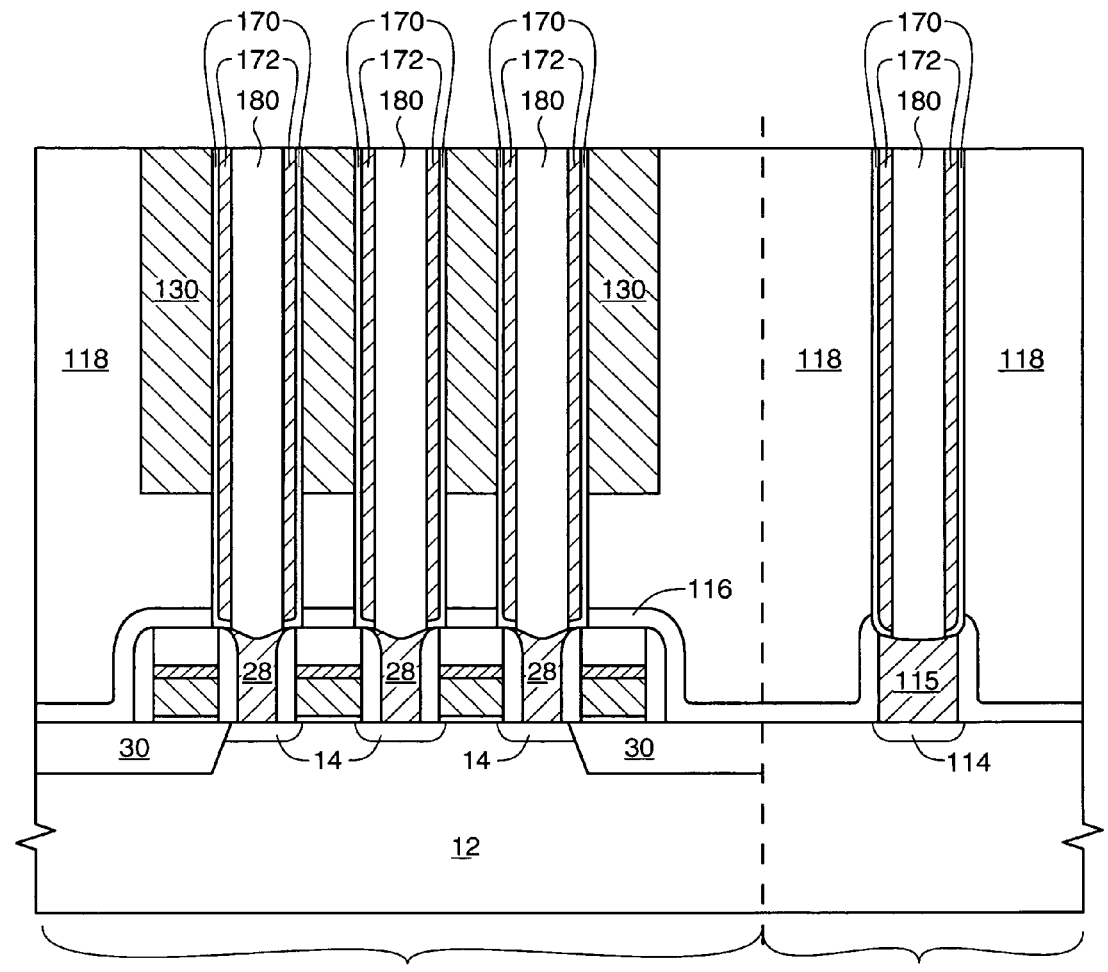
Figure 20:
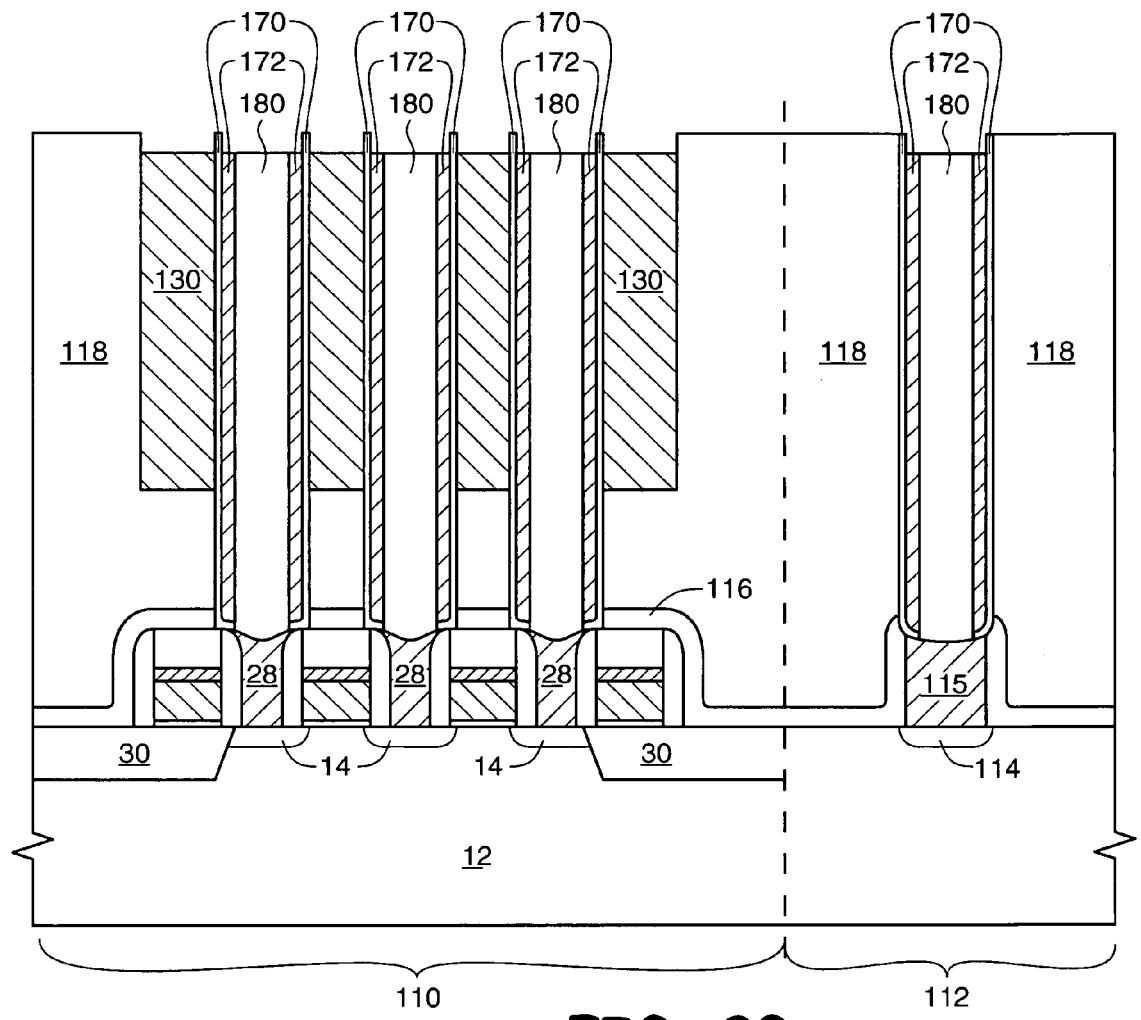

Next, the FIG. 19 structure is exposed to a bath of hydrofluoric acid (HF) then a bath of tetramethyl ammonium hydroxide (TMAH). Exposure to HF and TMAH provides a post-CMP clean and further results in recessing of polysilicon 130, 172, and the photoresist 180. The nitride, however, remains unetched by the HF and TMAH thereby forming the FIG. 20 structure. A subsequent photoresist clean, for example an ash step then a wet clean in a solution of sulfuric acid ($H_2SO_4$) and hydrogen peroxide ($H_2O_2$), removes the photoresist 180 to result in the FIG. 21 structure.

Figure 21:
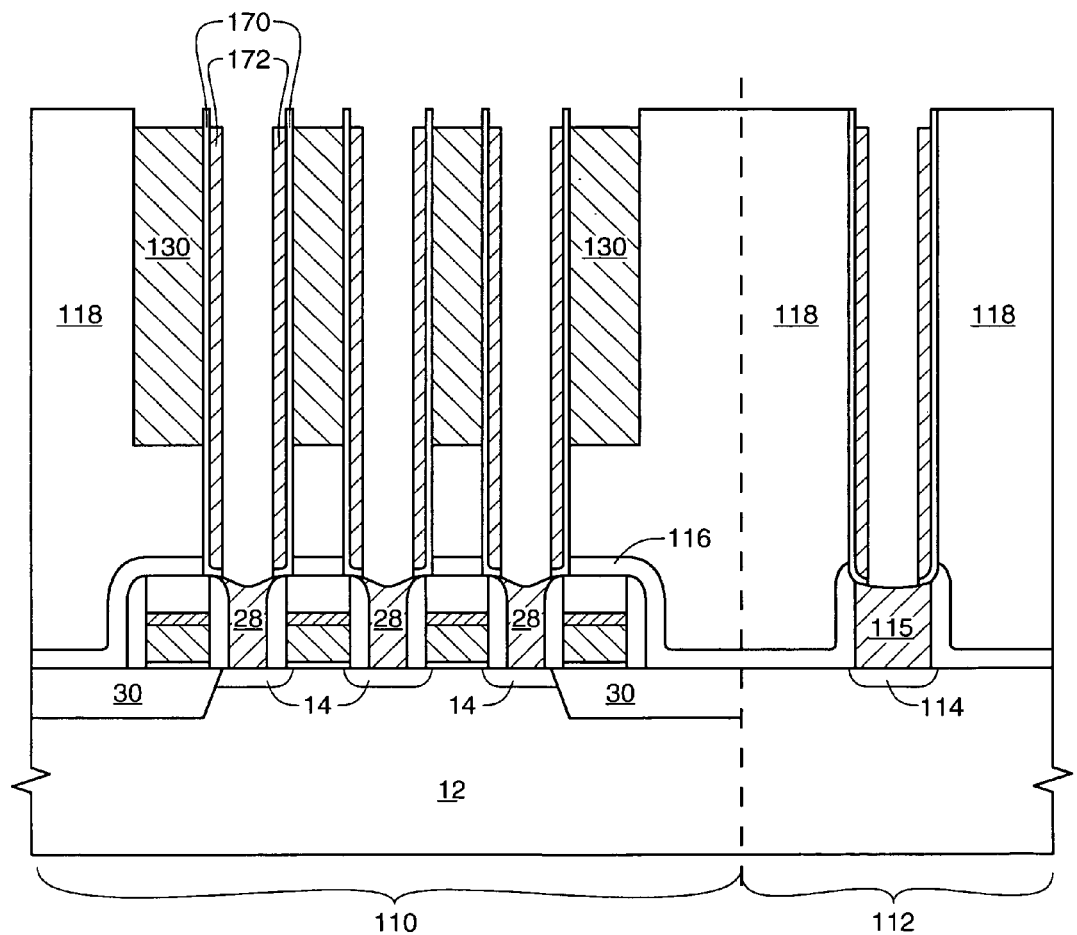
Figure 22:
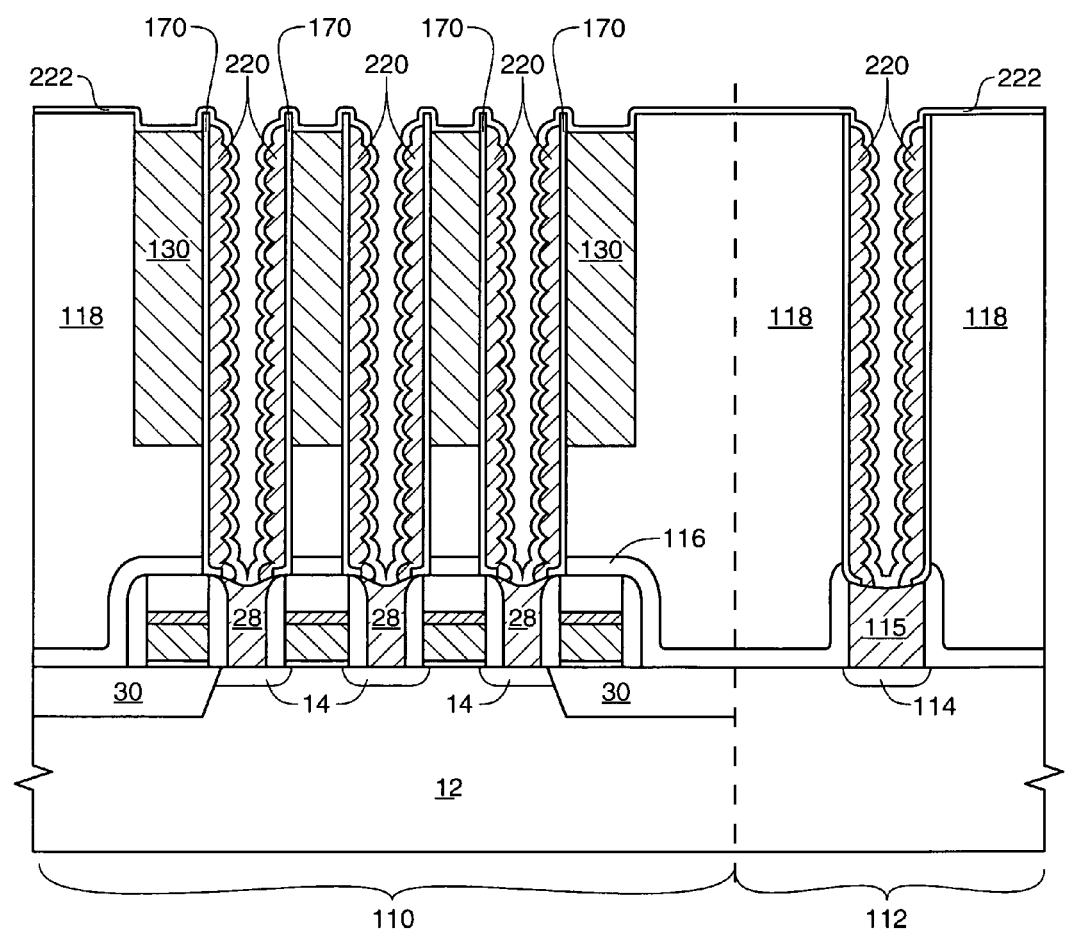

After forming the FIG. 21 structure the polysilicon bottom plate seed layer 172 may, optionally, be converted to hemispherical silicon grain (HSG) polysilicon 220 as depicted in FIG. 22. This step may be performed using disilane gas ($Si_2H_6$) in a CVD system. The disilane gas is decomposed into silicon radicals, then nucleation is performed and the smooth polysilicon is converted to HSG silicon. After converting the seed layer to HSG 220, a second cell dielectric layer 222 is formed over exposed surfaces according to means known in the art.

Figure 23:
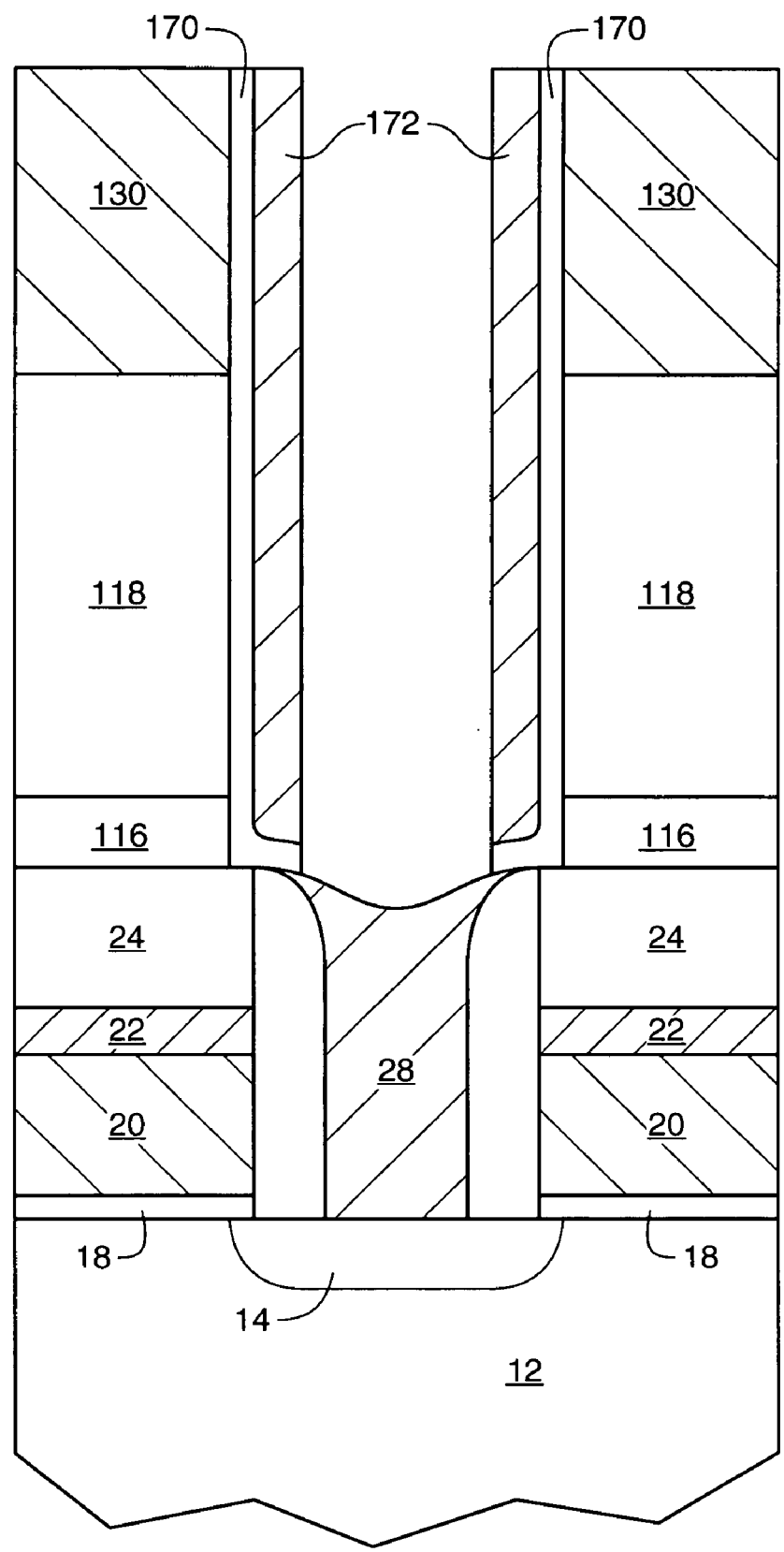
FIG. 23 is a cross section detailing a portion of the FIG. 21 structure.
Figure 24:
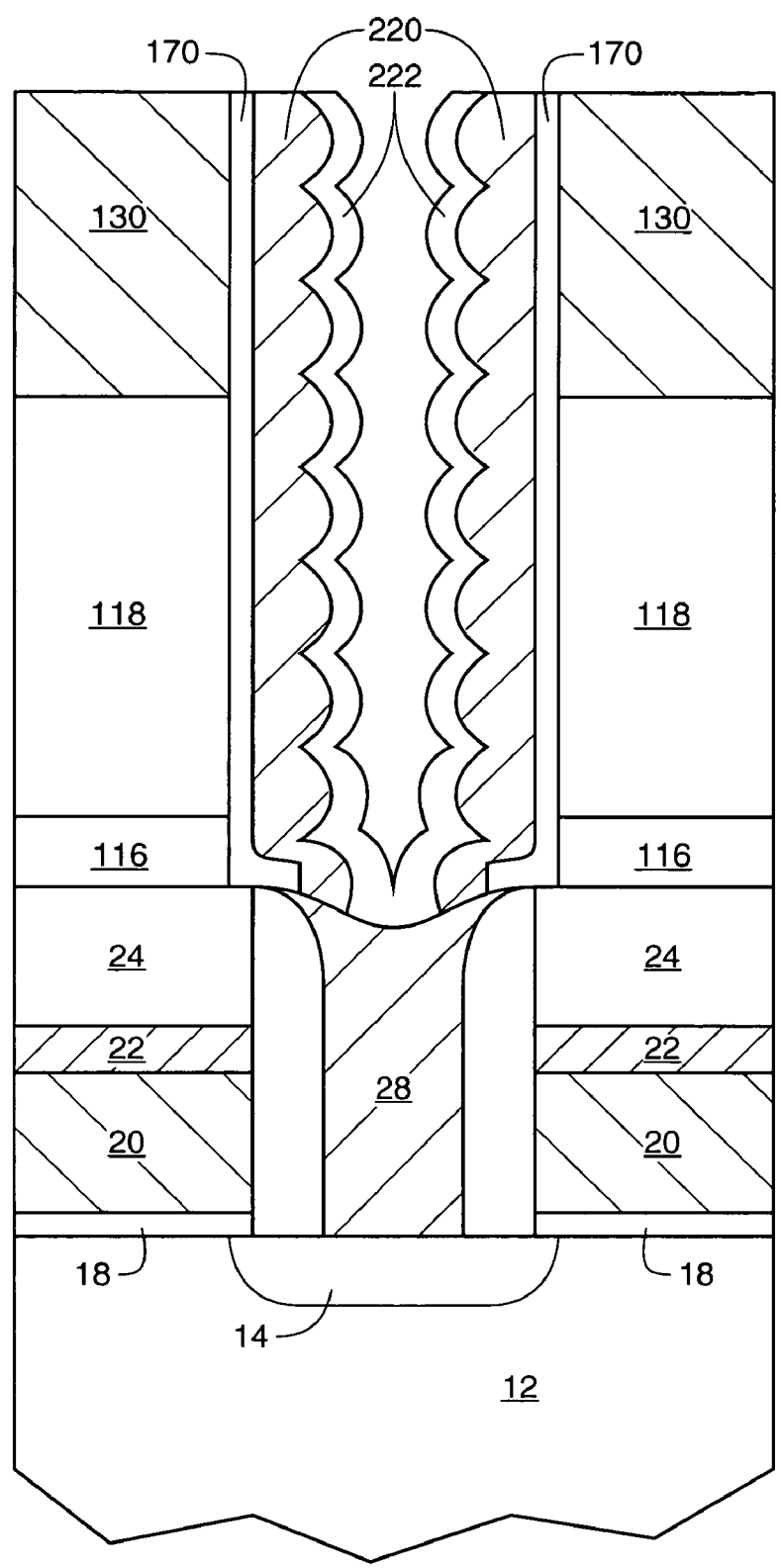
FIGS. 24 and 25 are cross sections detailing portions of the FIG. 22 structure.

Prior to converting the bottom plate seed layer to HSG polysilicon the seed layer may not actually contact pads 28, 115. FIG. 23 depicts detail of the FIG. 21 structure comprising pad 28, first cell dielectric layer 170 and seed layer 172. After converting the seed layer to HSG polysilicon, however, seed layer 172 expands to contact 28 and make electrical contact therewith as depicted in FIG. 24. Depending on the doping, pad 28 may also have some slight conversion to HSG during the conversion of the seed layer to HSG 220 as depicted in FIG. 24.

Figure 25:
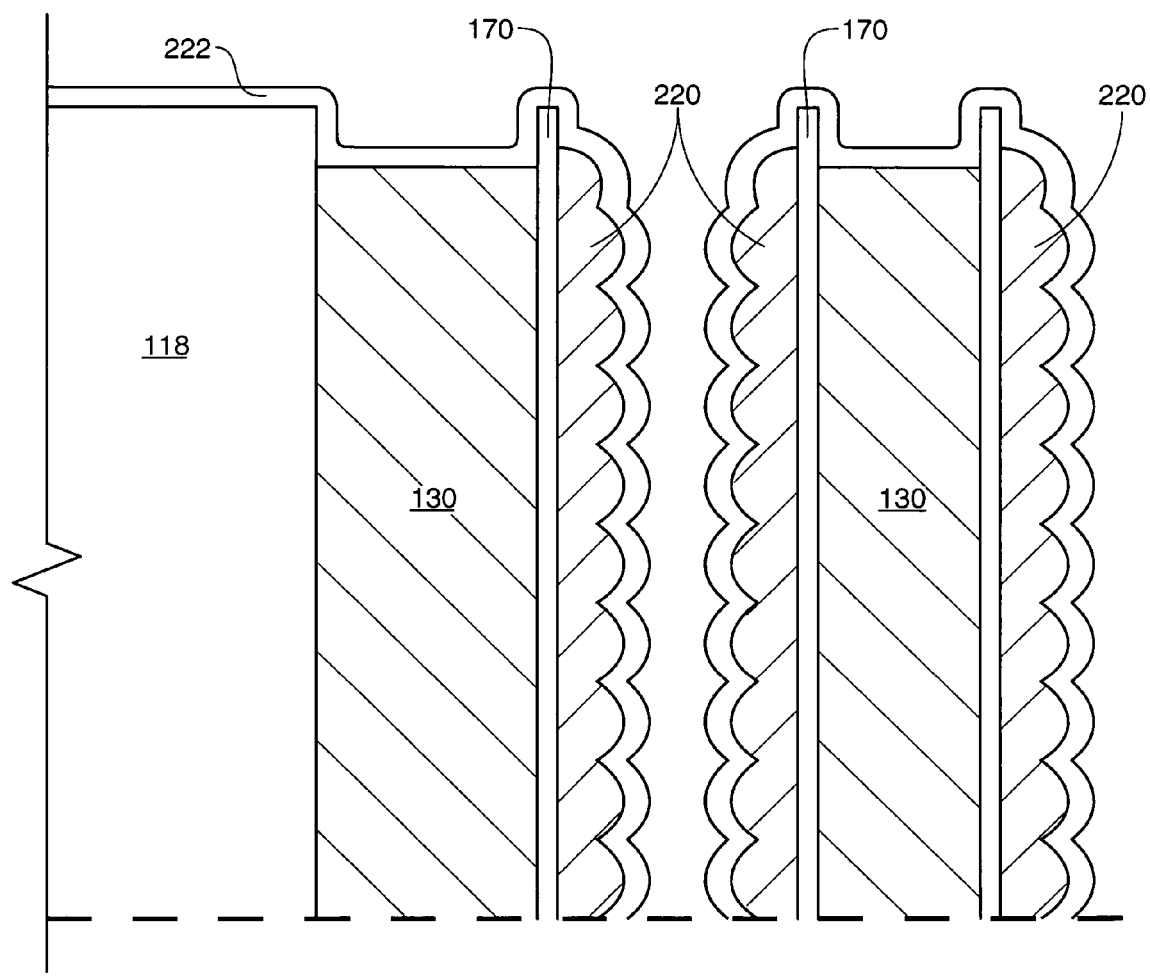

FIG. 25 depicts detail of the upper surface of the FIG. 22 structure. As a wet etch of the bottom plate layer with HF and TMAH as described above removes dielectric at a slower rate than it etches polysilicon, an upper portion of the first cell dielectric layer 170 extends above an upper portion of the bottom plate layer 220 and above an upper portion of first top plate layer 130 which is etched after removal of the horizontal portions of the first cell dielectric layer 170 during the etch between FIG. 17 and FIG. 18. If the upper portions of the first cell dielectric layer 170, bottom plate layer 220, and first top plate layer 130 were at the same level, polysilicon layers 220 and 130, portions of the bottom capacitor plate and top plate respectively, would be separated only by the thickness of the first cell dielectric layer 170. Forming a protruding second cell dielectric layer 222 as depicted "seals" the bottom plate layer 220 and electrically isolates it during operation of the completed device from the first top plate layer 130. Thus leakage of a charge stored on a capacitor comprising the first top plate layer 130 and bottom plate 220 is more resistant to charge leakage between layers 130 and 220 than if the protruding portion of the nitride 170 was not formed.

Figure 26:
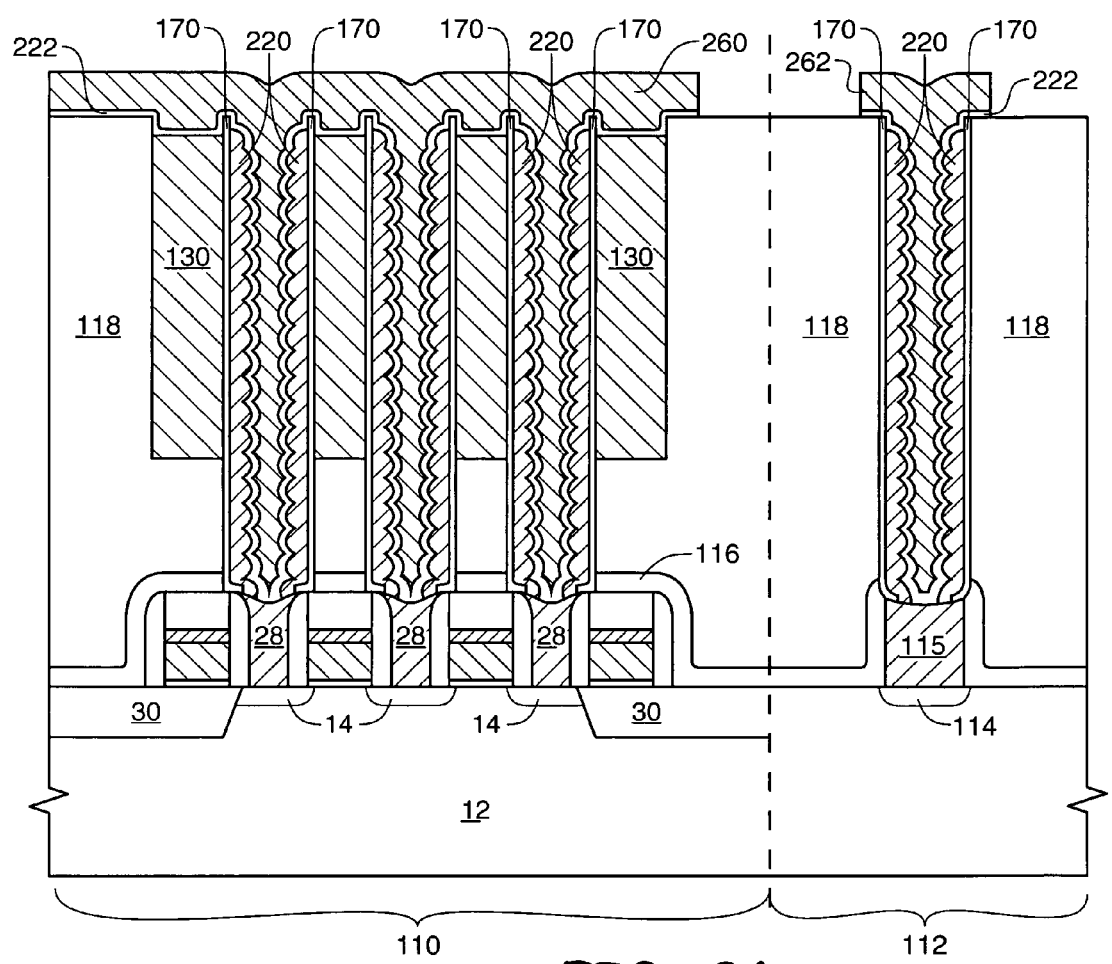
FIGS. 26–28 are cross sections depicting intermediate structures obtained during an embodiment of the present invention.

Referring to FIG. 26, after converting bottom plate 220 to HSG and forming the second cell dielectric layer 222, a patterned second capacitor top plate layer 260, for example a polysilicon layer between about 150 Å and about 5,000 Å thick, is formed according to means known in the art. Layer 260 is formed over the majority of the array, and in this embodiment is not formed over a portion of at least one first top plate layer portions. As depicted in FIG. 26 the first 130 and second 260 capacitor top plate layers in this embodiment are not yet electrically connected. However, various process modifications may allow for their coupling upon formation of layer 260. The present method describes various additional steps to electrically connect the two layers as described below. Further, FIG. 26 depicts a conductive plug 262 formed in the periphery concurrently during formation of the capacitor structures in the array, and is formed from layer 260. Formation of plug 262 is not required for the practice of the invention, but is depicted to demonstrate that concurrent processing of container capacitors in the array and conductive plugs in the periphery is possible and may be preferred to minimize mask steps.

Figure 27:
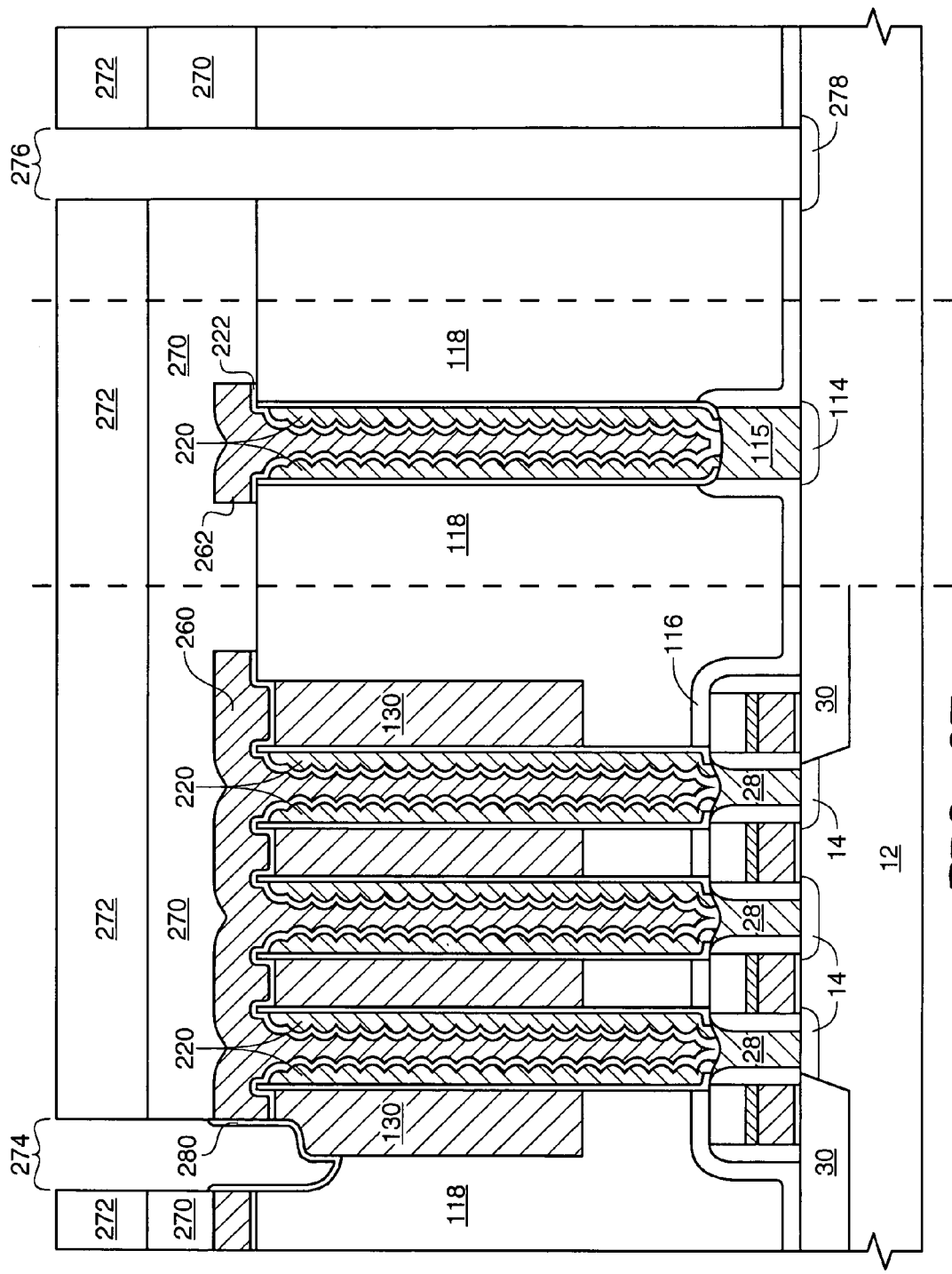

In the present embodiment, subsequent to forming the FIG. 26 structure, a planar dielectric layer 270 and a patterned photoresist layer 272 are formed as depicted in FIG. 27 according to means known in the art. The photoresist layer exposes the dielectric layer 270 at opening 274 and at opening 276. Opening 274 in this embodiment overlies at least a portion of the first container capacitor top plate layer 130, the portion which remains uncovered in FIG. 23. Opening 276 overlies a diffusion region 278, and this depiction demonstrates that another conductive feature, for example a digit (bit) line contact plug, may be formed concurrently during the capacitor formation to minimize mask steps. After forming dielectric 270 and photoresist 272, the exposed structures are etched to expose diffusion region 278 and to etch a portion of the exposed top plate layer 130.

A sufficient etch which removes the exposed dielectric comprises the use of $CF_4$ at a flow rate of 10 sccm, $O_2$ at a flow rate of 8 sccm, either of $C_4F_6$ or $C_4F_8$ at a flow rate of about 28 sccm, and argon at a flow rate of about 400 sccm using a power of between about 1400 watts and about 1900 watts, a pressure of about 35 millitorr for a duration of between about 60 seconds and about 140 seconds. This anisotropic etch clears the dielectric 270, 222, 118 from over diffusion region 278, and etches dielectric layers 270, 222, 118 over and around the first top plate layer portion 130 exposed in FIG. 23. During this etch a polymer 280 forms to coat exposed surfaces in the area where polysilicon is being etched, and eventually functions as an etch stop layer to prevent further etching of the polysilicon and dielectric in this region. This etch, therefore, is self-limiting in this area and prevents over etching of the polysilicon first top plate layer 130.

In another embodiment of the invention layer 260 in FIG. 26 is formed to cover all first top plate layer portions 130. A first etch then removes dielectric 260, polysilicon 260 which covers layer 130, and possibly cell dielectric 222. Subsequently, a second etch, which forms polymer 280, is used to etch layer 130 and possibly cell dielectric 222. This two-step etch is required to prevent polymer buildup during the etch of layer 260 which would stop etching before layer 260 is etched completely through. A second alternative would be to alternate the polymer-forming etch of layer 260 with a polymer-clearing etch to remove the polymer until layer 260 is etched completely through. After layer 260 is etched through, the polymer-forming etch may be continuously applied thereafter to form the structure of FIG. 27.

Figure 28:
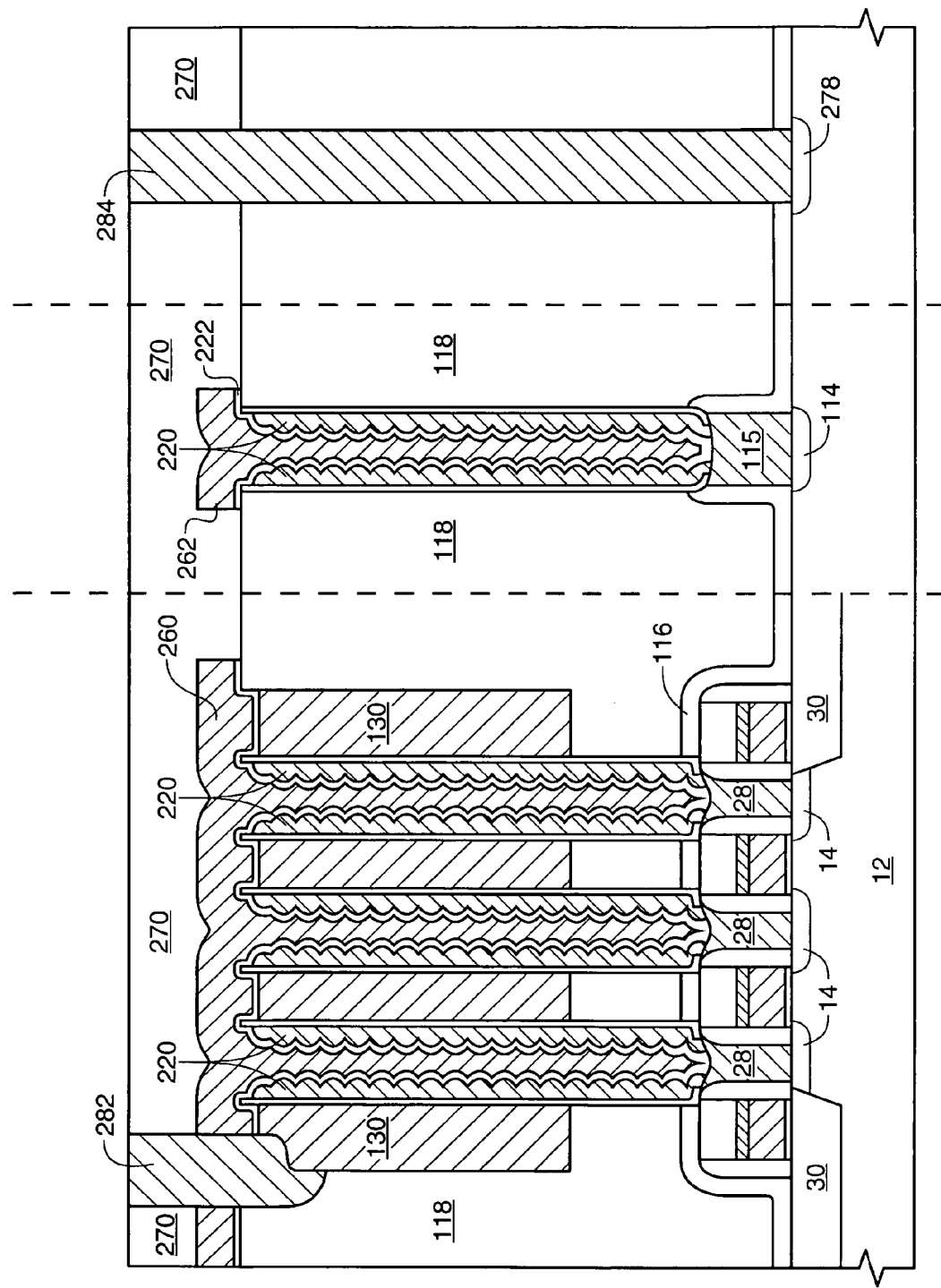

Subsequent to forming the FIG. 27 structure the polymer is cleared, for example using a dry strip using $O_2$ then a wet etch in a bath of $H_2SO_4$. A blanket conductive layer is formed over the wafer surface and within the openings at 274 and 276, and is then planarized to result in the FIG. 28 structure. Conductive strap 282 electrically connects first top plate layer 130 with second top plate layer 260, and conductive plug 284 provides an electrical connection of diffusion region 278. As layer 130 is a continuous layer as depicted in the plan view of FIG. 29, strapping layer 130 to layer 260 in a single location as depicted in FIG. 28 electrically connects all portions of layer 130 with layer 260. However, a single connection point may have an excessive resistance, and thus a plurality of connections points will be preferred in most embodiments.

Figure 29:
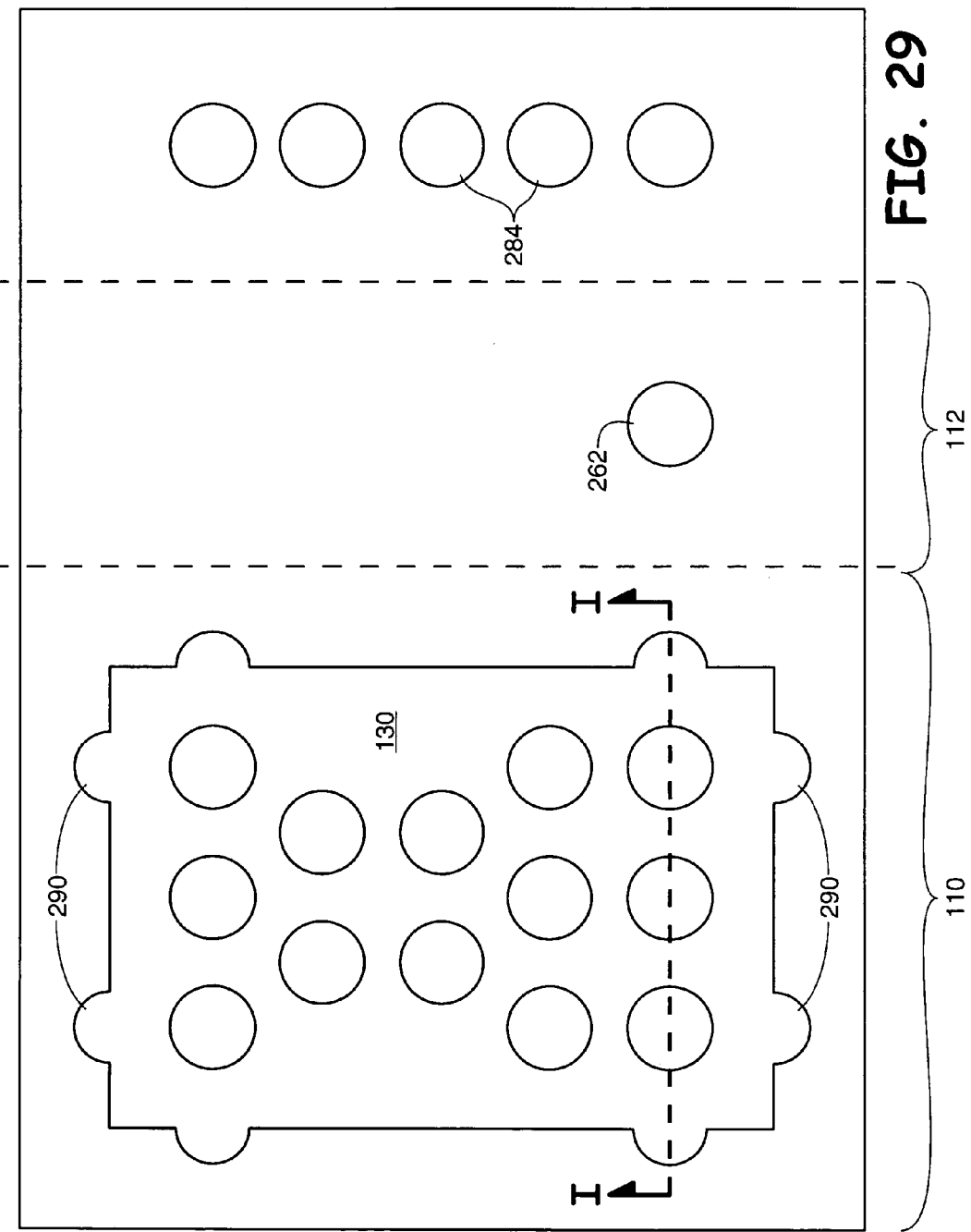
FIG. 29 is a plan view depicting an intermediate structure obtained during an embodiment of the invention.
Figure 30:
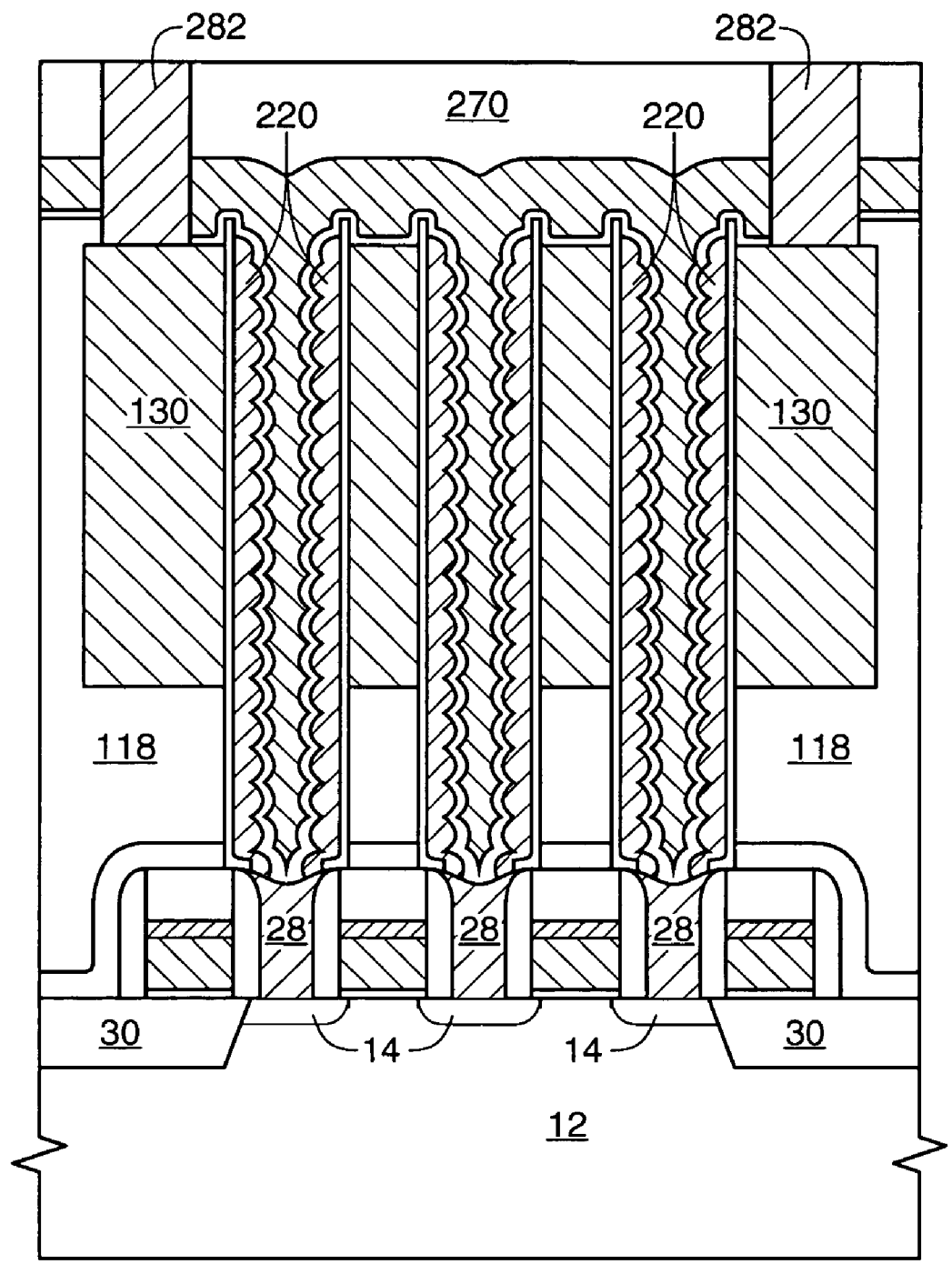
FIG. 30 is a cross section depicting an intermediate structure obtained during an embodiment of the invention of FIG. 29.

FIG. 29 depicts a plan view of a structure similar to that of FIG. 28, except that FIG. 29 depicts a plurality of "tabs" 290, which allow for an expanded point at which to connect the first 130 and second 260 top plate layers. FIG. 30 depicts a cross section of the FIG. 29 structure along A—A. Using the tabs as depicted, a dielectric etch which is selective to polysilicon may be used for the entire etch if layer 260 is patterned so that layer 260 is formed to have an opening over layer 130. If polysilicon 260 is formed over layer 130, an etch which removes both dielectric and polysilicon may be used to etch through polysilicon 260 and, once layer 260 is etched through, a dielectric etch selective to polysilicon may be continued until layer 130 is exposed. Plug 282 is formed in accordance with the description relative to FIG. 28 to electrically connect layer 260 with tabs 290 which are portions of first container capacitor top plate layer 130.

In another embodiment the polysilicon seed layer 172 of FIG. 17 may be converted prior to forming photoresist layer 180 of FIG. 18. HSG conversion in this embodiment may be completed before the anisotropic etch which removes the seed layer from layer 28, or preferably after the anisotropic etch.

It is contemplated that semiconductor device comprising the invention may be attached along with other devices to a printed circuit board, for example to a computer motherboard or as a part of a memory module used in a personal computer, a minicomputer, or a mainframe. The inventive device may further be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising:
   a first conductive capacitor top plate layer having a plurality of openings therethrough;
   a plurality of conductive capacitor bottom plates with one bottom plate formed at least partially within each opening in the first conductive capacitor top plate layer, wherein each bottom plate is separated from the first capacitor top plate layer by a first cell dielectric layer, and each bottom plate having an opening therein which defines a receptacle;
   a second conductive capacitor top plate layer formed within the receptacle defined by each of the plurality of capacitor bottom plates and electrically coupled with the first conductive capacitor top plate layer, wherein the second conductive capacitor top plate layer is separated from each capacitor bottom plate by a second cell dielectric layer.

2. The semiconductor device of claim 1 further comprising a plurality of contact pads, wherein each contact pad is electrically connected to one of the conductive capacitor bottom plates.

3. The semiconductor device of claim 2 further comprising the second cell dielectric layer contacting each contact pad.

4. The semiconductor device of claim 1 further comprising a conductive strap which contacts both the first and second conductive capacitor top plate layers to electrically connect the first and second conductive capacitor top plates together.

5. The semiconductor device of claim 1 wherein a height of the second conductive capacitor top plate layer is greater than a height of the first conductive capacitor top plate layer.

6. The semiconductor device of claim 1 further comprising an upper portion of the first cell dielectric layer extending above an upper surface of the first conductive capacitor top plate layer and of an upper surface of each conductive capacitor bottom plate.

7. The semiconductor device of claim 6 further comprising the second cell dielectric layer contacting the first cell dielectric layer at the upper portion of the first cell dielectric layer.

8. The semiconductor device of claim 1 wherein the bottom plate is a hemispherical silicon grain (HSG) layer.

9. A semiconductor device comprising:
   a storage capacitor comprising:
     a first capacitor top plate layer having a plurality of openings therethrough;
     a plurality of capacitor bottom plates, with each bottom plate located at least partially within one of the plurality of openings in the first capacitor top plate layer, wherein each bottom plate comprises a recess therein;
     a second capacitor top plate layer partially located within each of the plurality of openings in the first capacitor top plate layer and within each recess of each bottom plate and having a portion located over each capacitor bottom plate and a portion located over the first capacitor top plate layer; and
     a conductive strap which contacts both the first and second capacitor top plate layers.

10. The semiconductor device of claim 9 further comprising:
    a first cell dielectric layer which separates the first top plate layer from each bottom plate; and
    a second cell dielectric layer which separates each bottom plate from the second capacitor top plate layer and which separates the first capacitor top plate layer from the second capacitor top plate layer.

11. The semiconductor device of claim 10 further comprising the conductive strap contacting the second cell dielectric layer.

12. The semiconductor device of claim 9 wherein the bottom plate is a hemispherical silicon grain (HSG) layer.

* * * * *